United States Patent
Sato et al.

(10) Patent No.: US 10,442,735 B2
(45) Date of Patent: Oct. 15, 2019

(54) SHEET, INORGANIC-SUBSTANCE-LAMINATED SHEET AND ELECTRONIC DEVICE USING SAME

(71) Applicant: TORAY INDUSTRIES, INC., Tokyo (JP)

(72) Inventors: Yoshikazu Sato, Otsu (JP); Keiichiro Nomura, Nagoya (JP); Motoyuki Suzuki, Otsu (JP); Sadayuki Kobayashi, Nagoya (JP); Minoru Yoshida, Otsu (JP)

(73) Assignee: Toray Industries, Inc. (JP)

( * ) Notice: Subject to any disclaimer, the term of this patent is extended or adjusted under 35 U.S.C. 154(b) by 763 days.

(21) Appl. No.: 14/895,722

(22) PCT Filed: Jun. 20, 2014

(86) PCT No.: PCT/JP2014/066411
§ 371 (c)(1),
(2) Date: Dec. 3, 2015

(87) PCT Pub. No.: WO2014/208463
PCT Pub. Date: Dec. 31, 2014

(65) Prior Publication Data
US 2016/0137554 A1    May 19, 2016

(30) Foreign Application Priority Data

Jun. 27, 2013 (JP) .................................. 2013-134665
Aug. 9, 2013 (JP) .................................. 2013-166330

(51) Int. Cl.
*C04B 35/453* (2006.01)
*C08F 2/44* (2006.01)
(Continued)

(52) U.S. Cl.
CPC ............ *C04B 35/453* (2013.01); *B32B 3/085* (2013.01); *B32B 27/08* (2013.01); *C04B 35/547* (2013.01);
(Continued)

(58) Field of Classification Search
CPC ........ C04B 35/453; C04B 35/547; C08J 7/06; C08J 7/045; C08J 5/18; C08J 2433/12;
(Continued)

(56) References Cited

U.S. PATENT DOCUMENTS 9,090,780 B2 * 7/2015 Uebayashi ................ B32B 9/00
2003/0117707 A1   6/2003 Uchida
(Continued)

FOREIGN PATENT DOCUMENTS

JP        08142252     6/1996
JP       2001172405    6/2001
(Continued)

OTHER PUBLICATIONS

English Translation of Hiroyuki et al. (JP2006106224) provided by the EPO website, internet retrieval date of Sep. 24, 2018. (Year: 2006).*

(Continued)

*Primary Examiner* — Jonathan C Langman
(74) *Attorney, Agent, or Firm* — RatnerPrestia

(57) ABSTRACT

The present invention aims to provide an inorganic substance-laminated sheet that can be used suitably for applications that require high gas barrier properties. The inorganic substance-laminated sheet includes a sheet having a dispersed structure with a structural period of 0.001 μm to 100 μm on at least one surface and an inorganic substance layer covering the surface having the dispersed structure.

11 Claims, 3 Drawing Sheets

(51) Int. Cl.
*C08F 2/50* (2006.01)
*C08J 5/18* (2006.01)
*B32B 27/08* (2006.01)
*B32B 3/08* (2006.01)
*C04B 35/547* (2006.01)
*C23C 14/10* (2006.01)
*C23C 14/34* (2006.01)
*C08J 7/04* (2006.01)
*C08J 7/06* (2006.01)

(52) U.S. Cl.
CPC ............... *C08F 2/44* (2013.01); *C08F 2/50* (2013.01); *C08J 5/18* (2013.01); *C08J 7/045* (2013.01); *C08J 7/06* (2013.01); *C23C 14/10* (2013.01); *C23C 14/34* (2013.01); *B32B 2307/7242* (2013.01); *B32B 2439/70* (2013.01); *B32B 2439/80* (2013.01); *B32B 2457/20* (2013.01); *C08J 2333/12* (2013.01); *C08J 2367/02* (2013.01); *C08J 2433/08* (2013.01); *C08J 2433/12* (2013.01)

(58) Field of Classification Search
CPC ............ C08J 2333/12; C08J 2433/08; C08J 2367/02; C23C 14/34; C23C 14/10; B32B 3/085; B32B 27/08; B32B 2457/20; B32B 2439/80; B32B 2439/70; B32B 2307/7242; C08F 2/44; C08F 2/50
See application file for complete search history.

(56) References Cited

U.S. PATENT DOCUMENTS

| | | | |
|---|---|---|---|
| 2004/0266957 A1* | 12/2004 | Kobayashi | C08J 3/005 525/437 |
| 2007/0032577 A1 | 2/2007 | Kanzawa | |
| 2008/0057228 A1* | 3/2008 | Horie | G02B 5/0215 428/1.32 |
| 2011/0003093 A1* | 1/2011 | Hayashi | C08F 265/04 428/1.33 |
| 2013/0089734 A1* | 4/2013 | Nakamura | B32B 15/082 428/339 |

FOREIGN PATENT DOCUMENTS

| | | | | |
|---|---|---|---|---|
| JP | 2002267812 | | 9/2002 | |
| JP | 2004001888 | | 1/2004 | |
| JP | 2006-106224 | * | 4/2006 | ............... G02B 5/02 |
| JP | 2008255266 | | 10/2008 | |
| JP | 4306263 | | 7/2009 | |
| JP | 2012000812 | | 1/2012 | |
| JP | 5104711 | | 12/2012 | |
| JP | WO-2013-035689 | * | 3/2013 | ............... B32B 9/00 |
| WO | 2004087812 | | 10/2004 | |

OTHER PUBLICATIONS

International Search Report for International Application No. PCT/JP2014/066411 dated Sep. 30, 2014.

* cited by examiner

[Fig.1]
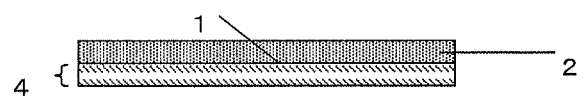
[Fig.2]
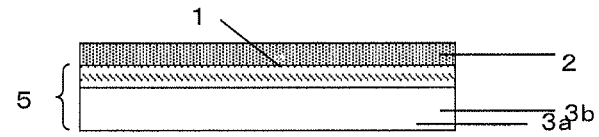
[Fig.3]
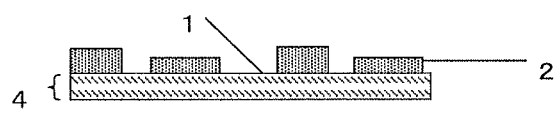
[Fig.4]
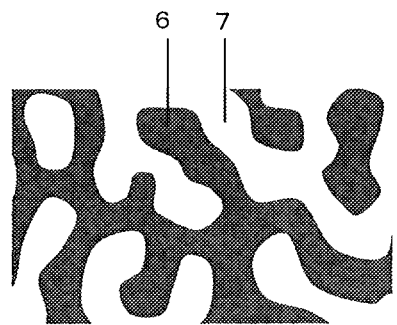

[Fig.5]
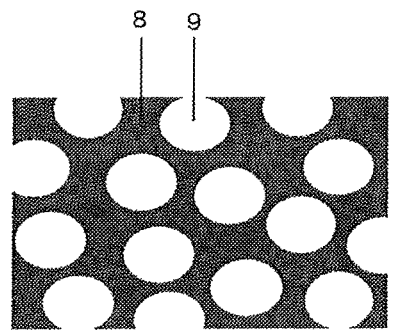
[Fig.6]
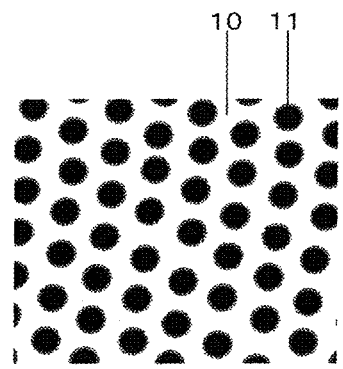
[Fig.7]
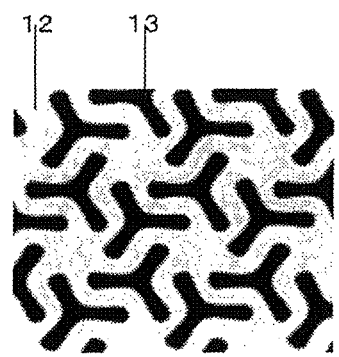

[Fig.8]
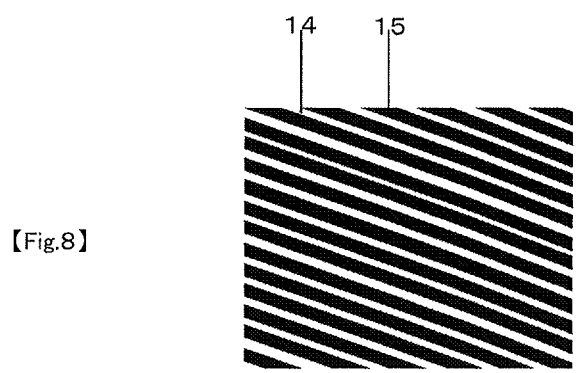

SHEET, INORGANIC-SUBSTANCE-LAMINATED SHEET AND ELECTRONIC DEVICE USING SAME

CROSS REFERENCE TO RELATED APPLICATIONS

This is the U.S. National Phase application of PCT/JP2014/066411, filed Jun. 20, 2014, which claims priority to Japanese Patent Application No. 2013-134665, filed Jun. 27, 2013 and Japanese Patent Application No. 2013-166330, filed Aug. 9, 2013, the disclosures of these applications being incorporated herein by reference in their entireties for all purposes.

FIELD OF THE INVENTION

The present invention relates to a sheet that, when laminated with a layer of an inorganic compound, serves to control the structure of the layer of an inorganic compound to provide an inorganic substance-laminated sheet having improved gas barrier properties and also relates to an inorganic substance-laminated sheet that serves effectively for producing articles that require high gas barrier properties including packaging materials for foodstuffs and pharmaceuticals and electronic devices including solar batteries, touch panels, electronic papers, liquid crystal displays, organic EL displays, organic EL lighting, and other organic EL devices.

BACKGROUND OF THE INVENTION

Polymer alloy techniques are attracting increasing attention as a way of controlling fine structures of resin and a film formed of resin produced by a polymer alloy technique has been proposed (Patent document 1).

For example, physical vapor deposition techniques (PVD techniques) such as vacuum deposition, sputtering, and ion plating, and chemical vapor deposition techniques (CVD techniques) such as plasma enhanced chemical vapor deposition, thermal chemical vapor deposition, and photochemical vapor deposition have been proposed as methods for forming a layer of an inorganic compound on a film or sheet and controlling the composition of the layer. Major applications of these techniques include, for example, gas barrier laminates containing a gas barrier ply produced by forming a layer of an inorganic substance (or inorganic oxide) such as aluminum oxide on the surface of a base by the above mentioned techniques. Gas barrier laminates are used as packaging materials for foodstuffs and pharmaceuticals that require high barrier properties against gas such as water vapor and oxygen and members of electronic devices including solar batteries, touch panels, electronic papers, liquid crystal displays, and organic EL displays and lighting.

Examples of such gas barrier laminates proposed so far include those containing a gas barrier layer formed mainly of a silicon oxide produced on a base by plasma CVD using a gas containing oxygen and vapor of an organic silicon compound (Patent document 2). Another document proposes a gas barrier laminate produced by forming a resin layer on a substrate and covering it with a gas barrier layer of a silicon based compound (Patent document 3).

PATENT DOCUMENTS

Patent document 1: Japanese Patent No. 4306263
Patent document 2: Japanese Unexamined Patent Publication (Kokai) No. HEI 8-142252
Patent document 3: Japanese Patent No. 5104711

SUMMARY OF THE INVENTION

However, such gas barrier laminates as proposed in Patent documents 2 and 3 tend to have the problem of being poor in gas barrier properties. In addition, the film proposed in Patent document 1 is produced by controlling the fine structure inside a resin film, but even if a layer of an inorganic compound is formed, for example, on the surface of the film, it will be difficult to control the structure of the inorganic compound.

In view of these problems with conventional techniques, an aspect of the present invention provides a sheet that serves to control the structure of a layer of an inorganic compound during the formation of that layer of an inorganic compound in order to produce an inorganic substance-laminated sheet with improved gas barrier properties and also provide an inorganic substance-laminated sheet that can be applied effectively to producing articles that require high gas barrier properties.

The present invention includes the following embodiments to solve such problems given above. Specifically:
(1) An inorganic substance-laminated sheet comprising a sheet having a dispersed structure with a structural period of 0.001 µm to 100 µm on at least one surface and an inorganic substance layer covering the surface having the dispersed structure.
(2) An inorganic substance-laminated sheet as described in paragraph (1), wherein the sheet comprises a base and a substrate layer having a dispersed structure with a structural period of 0.001 µm to 100 µm, the substrate layer covering at least one surface of the base.
(3) An inorganic substance-laminated sheet as described in either paragraph (1) or (2), wherein the dispersed structure is a phase-separated structure.
(4) An inorganic substance-laminated sheet as described in paragraph (3), wherein the phase-separated structure is either a co-continuous type one or a sea-island type one.
(5) An inorganic substance-laminated sheet as described in any one of paragraphs (1) to (4), wherein the sheet contains a polymer alloy including at least two resin components.
(6) An inorganic substance-laminated sheet as described in paragraph (5), wherein the co-continuous type structure or the sea-island type structure in the inorganic substance-laminated sheet is one formed by subjecting at least two resin components to phase separation through spinodal decomposition.
(7) An inorganic substance-laminated sheet as described in either paragraph (5) or (6), wherein the polymer alloy contains a bi- or poly-functional crosslinked component.
(8) An inorganic substance-laminated sheet as described in any one of paragraphs (1) to (7), wherein the inorganic substance layer contains at least one element that belongs to any of the 1st to 17th groups in the 2nd to 6th rows of the periodic table.
(9) An inorganic substance-laminated sheet as described in any one of paragraphs (1) to (8), wherein the inorganic substance layer contains a zinc compound and a silicon compound.
(10) An inorganic substance-laminated sheet as described in any one of paragraphs (1) to (9), wherein the inorganic substance layer is either an inorganic A-layer or an inorganic B-layer as specified below:

inorganic A-layer: a layer of a phase in which zinc oxide, silicon dioxide, and aluminum oxide coexist, and
inorganic B-layer: a layer of a phase in which zinc sulfide and silicon dioxide coexist.

(11) A production method for an inorganic substance-laminated sheet as described in any one of paragraphs (1) to (10) comprising a sheet production process containing a step for forming a phase-separated structure via a mutually dissolved state of components adopted for sheet production.

(12) A production method for an inorganic substance-laminated sheet as described in paragraph (11), wherein the phase-separated structure is formed by using electromagnetic wave or particle beam.

(13) An electronic device comprising an inorganic substance-laminated sheet as described in any one of paragraphs (1) to (10) or an inorganic substance-laminated sheet produced by a production method as described in any one of paragraphs (11) or (12).

(14) A sheet having a dispersed structure with a structural period of 0.001 μm to 100 μm on at least one surface.

(15) A sheet production method as described in paragraph (14) comprising a sheet production process containing a step for forming a phase-separated structure via a mutually dissolved state of components adopted for sheet production.

The invention can provide a sheet that serves to control the structure of a layer of an inorganic compound (hereinafter occasionally referred to as inorganic substance layer) during the formation of the inorganic substance layer in order to produce an inorganic substance-laminated sheet with improved gas barrier properties and also provide an inorganic substance-laminated sheet having high gas barrier properties.

BRIEF DESCRIPTION OF THE DRAWINGS

FIG. 1 is a schematic diagram of a cross section of an example (in a monolayer form) of the inorganic substance-laminated sheet according to the present invention.

FIG. 2 is a schematic diagram of a cross section of an example (in a multilayer laminate form) of the inorganic substance-laminated sheet according to the present invention.

FIG. 3 is a schematic diagram of a cross section of an example (in a multilayer laminate form) of the inorganic substance-laminated sheet according to the present invention that has an inorganic substance layer different from that in FIG. 2.

FIG. 4 is a schematic diagram of an example of the dispersed structure at the surface of the sheet according to the present invention (the dispersed structure is a co-continuous type phase-separated structure in this example).

FIG. 5 is a schematic diagram of an example of the dispersed structure at the surface of the sheet according to the present invention (the dispersed structure is a sea-island type phase-separated structure in this example).

FIG. 6 is a schematic diagram of an example of the dispersed structure at the surface of the sheet according to the present invention (the dispersed structure is a cylinder type phase-separated structure in this example).

FIG. 7 is a schematic diagram of an example of the dispersed structure at the surface of the sheet according to the present invention (the dispersed structure is a gyroid type phase-separated structure in this example).

FIG. 8 is a schematic diagram of an example of the dispersed structure at the surface of the sheet according to the present invention (the dispersed structure is a lamella type phase-separated structure in this example).

DESCRIPTION OF EMBODIMENTS OF THE INVENTION

[Inorganic Substance-Laminated Sheet]

The inorganic substance-laminated sheet according to embodiments of the present invention comprises a sheet having a dispersed structure with a structural period of 0.001 μm to 100 μm at least on one surface and an inorganic substance layer stacked on the surface having the dispersed structure.

FIG. 1 and FIG. 2 each give a schematic diagram of a cross section of an example of the inorganic substance-laminated sheet according to the present invention. FIG. 1 illustrates an embodiment in which a monolayer sheet 4 has a surface 1 with a dispersed structure on which an inorganic substance layer is laminated, and FIG. 2 illustrates an embodiment in which a laminate sheet 5 formed of a base 3b and a substrate layer 3a has a surface 1 with a dispersed structure on which an inorganic substance layer is laminated. Details of the sheets 4 and 5 and the inorganic substance layer 2 will be described later. Thus, an inorganic substance layer having a controlled structure can be obtained by forming an inorganic substance layer 2 on at least one side, referred to as surface 1, of a sheet having a dispersed structure with a structural period of 0.001 μm to 100 μm so that an inorganic substance-laminated sheet having such a structure is developed. This makes it possible to obtain an inorganic substance-laminated sheet having high gas barrier properties and such an inorganic substance-laminated sheet can serve for a variety of uses.

Here, the constitution of the inorganic substance layer is not limited to FIGS. 1 and 2 in which such a layer is formed over the entire surface of the sheet, and the inorganic substance layer may have a constitution as shown in FIG. 3 in which it exists only in some regions of the surface of the sheet where, for example, gas barrier properties are required.

[Sheet]

The sheet according to an embodiment of the present invention has a dispersed structure with a structural period of 0.001 μm to 100 μm at least on one surface.

For the present invention, the term "being dispersed" suggests that two or more dissimilar components form separated structures of a size larger than the radius of inertia of each molecule, or structures that are not mixed with each other at the molecular level, and the term "dispersed structure" refers to a structure formed thereof.

For the present invention, as long as the dispersed structure on the surface has a structural period in a range as specified for the present invention, there are no specific limitations on the constituent components, constitution, and production method to be used to form such a dispersed structure and, for example, it may be formed of elemental substances or chemical compounds containing two or more mutually non-compatible organic components or inorganic components or formed of hybrid components of only organic components, only inorganic components, or both organic components and inorganic component. Furthermore, one or more components forming the dispersed structure may have a specific shape such as spherical (e.g. particles), non-spherical, or indeterminate. More specifically, the dispersed structure for aspects of the present invention represents a superordinate concept above the phase-separated structure, and the concept also includes, for example, resin containing dispersed particles, besides the phase-separated structure (it should be noted that the term "dispersed structure" is also used in Patent document 3, but the "dispersed structure" referred to in the document represents a subordinate concept below the phase-separated structure and corresponds to the sea-island structure referred to for the present invention).

For the present invention, the expression "having a dispersed structure at least on one surface" means that the dispersed structure exists in the region to a depth of 10 nm from the interface of a sheet, substrate layer, etc., with the air, an inorganic substance layer, etc. Specific examples of such a sheet having a dispersed structure at least on one surface include: (i) a monolayer sheet having a dispersed structure in which the dispersed structure exists at least on one surface thereof (for example, see the member 4 in FIG. 1) and (ii) a laminate sheet containing a substrate layer having a dispersed structure located at least on one surface of a base (for example, see the member 5 in FIG. 2). Hereinafter, the former and the latter may be referred to as sheet (i) and sheet (ii), respectively, when a monolayer sheet and a laminate sheet are discussed separately. When the term "sheet" is used singly, it should be regarded as referring collectively to sheet (i) and sheet (ii) and similarly, if the term "the surface of a sheet" is used singly, it should be regarded as referring collectively to the surface of sheet (i) and the surface of the substrate layer in sheet (ii).

For an embodiment of the present invention, the dispersed structure on the surface of a sheet has a structural period of 0.001 μm to 100 μm. The structural period referred to herein is a repeating unit of structures that are located repeatedly with a constant period and can be determined by field emission type scanning electron microscopy. More specifically, it is calculated by the method described in Examples given later.

The structural period of a dispersed structure is 0.001 μm to 100 μm, preferably 0.005 μm to 50 μm, more preferably 0.01 μm to 1 μm, still more preferably 0.01 to 0.1 μm, and most preferably 0.01 μm to 0.03 μm. Such a structural period is preferable because it ensures easy control of the structure of an inorganic substance layer.

The existence of a dispersed structure can be examined by microscopic observation. To check for a dispersed structure, it will be useful to use an optical microscope, scanning electron microscope (including field emission type scanning electron microscope), transmission electron microscope, or atomic force microscope, depending on the structural period.

Then, the structural period of the dispersed structure can be measured by electron microscope observation according to the following procedure. As examples of the dispersed structure, the definitions of a sea-island type phase-separated structure and a co-continuous type phase-separated structure are described with reference to FIGS. 4 and 5.

As an example of the dispersed structure, FIG. 4 shows a schematic diagram in which the dispersed structure is a co-continuous type phase-separated structure. The method for this example can be applied to other similar structures even if they are not phase-separated. Specifically, a square area is adopted arbitrarily in an image taken by electron microscopy and 10 straight lines are drawn at random, followed by identifying the intersections between the straight lines and the phase interface. The distances between adjacent intersections are measured for each of the 10 straight lines, and the number average of the measurements is defined as structural period. Here, each straight line should make 20 or more and less than 200 intersections with the boundaries between the phase A and the phase B.

Here, the distance referred to herein is the real distance and the real distance is measured based on the scale bar shown in the electron microscopic image (the same applies hereinafter).

As an example of the dispersed structure, FIG. 5 shows a schematic diagram in which the dispersed structure is a sea-island type phase-separated structure. The method for this example can be applied to discontinuously dispersed particles even if they do not form a phase-separated structure. Method A and method B described below are available for making measurements in these cases and for the present invention, a structural period is regarded as being in the range of 0.001 μm to 100 μm if at least either method A or method B gives a measured structural period in this range.

(Method A)

In electron microscopic observation, an arbitrary area that contains 10 or more and less than 100 regions of island phase B (hereinafter, occasionally referred to as island phase B regions), which are numbered 9, are selected in a sea-island type phase-separated structure, and 10 straight lines are drawn in the area, followed by identifying the intersections between the straight lines and the phase interface. The distances between adjacent intersections are measured for each of the 10 straight lines, and the number average of the measurements is defined as structural period. Here, each straight line should make 20 or more and less than 200 intersections with the boundaries between the phase A and the phase B.

(Method B)

In electron microscopic observation, three appropriate areas each containing 10 or more and less than 100 regions of island phase B (hereinafter, occasionally referred to as island phase B regions), which are numbered 9, are selected in a sea-island type phase-separated structure, and the number average of the size of the island phase B regions in the area is defined as structural period. Here, the size of an island phase B region is the length of the shortest straight line connecting a point on the phase interface to another point on the phase interface through the gravity center of the island phase region.

The sheet according to the present invention preferably has a thickness of 50 nm or more and 1,000 nm or less. If it is 50 nm or less, it will be sometimes difficult during the formation of an inorganic substance layer to control the structure of the inorganic substance layer due to the influence of irregularities of the surface of the sheet. If it is more than 1,000 μm, on the other hand, the productivity may decrease or defects such as cracks may occur in the inorganic substance layer due to warp of the sheet caused by increased stress. Here, the thickness of a sheet can be determined from cross-sectional images observed by transmission electron microscopy (TEM) or scanning electron microscopy (SEM).

For the sheet according to the present invention, in particular, the dispersed structure is preferably a phase-separated structure. If it is a phase-separated structure, a dispersed structure with an intended structural period can be formed easily and accordingly, during the formation of an inorganic substance layer, the structure of the inorganic substance layer can be controlled to ensure improved gas barrier properties. Phase separation as referred to herein means the mechanism in which two or more dissimilar components that coexist in a mutually dissolved state separate to respective phases in which each component accounts for the primary part. Furthermore, a phase-separated structure refers to one that is formed through phase separation.

The existence of a phase-separated structure can be identified by microscopic observation. For the determination of a phase-separated structure, an optical microscope, scanning electron microscope, or transmission electron microscope may be selected according to the structural period and used to make observations for a phase-separated structure.

In the sheet according to the present invention, it is preferable for the phase-separated structure to be either a co-continuous type one or a sea-island type one. If the phase-separated structure is a co-continuous type one or a sea-island type one, it will be easy to control the structure at an intended structural period and, during the formation of an inorganic substance layer, the structure of the inorganic substance layer can be controlled easily to provide an inorganic substance-laminated sheet with high gas barrier properties.

Here, a co-continuous type structure is one in which separated regions of two or more different phases are entangles three dimensionally to form a continuous structure. A schematic diagram of such a co-continuous structure is shown in, for example, Chapters 10.1 and 11 of "Porima Aroi—Kiso to Oyo" (Polymer Alloy—Basics and Application, in Japanese), 2nd Ed., ed. by Society of Polymer Science, Japan, pub. by Tokyo Kagaku Dojin. On the other hand, a sea-island structure is one that contains particle-like regions in which one component accounts for the major proportion and a matrix in which the other component accounts for the major proportion, with the former component being scattered in a particle-like manner in the matrix. For the present invention, furthermore, the phase-separated structure may include a lamella type structure (see FIG. 8), a gyroid type structure (see FIG. 7), or a cylinder type structure (see FIG. 6) instead of a co-continuous type structure or a sea-island type structure.

Here, a lamella type structure is a phase-separated structure in which layers of two different phases are stacked one on the other. A gyroid type structure is a co-continuous phase-separated structure that is a phase-separated structure composed of two phases with three-way branching. A cylinder type structure is a phase-separated structure in which one of the two phases forms rods, which are regularly aligned in one direction at least in some local areas.

Here, the structural period of a co-continuous structure or sea-island structure can be identified by microscopic observation. A structural period in the range of 0.1 µm to 100 µm can be identified by optical microscopy. A structural period in the range of 0.001 µm or more and less than 0.1 µm can be identified by transmission electron microscopy or scanning electron microscopy.

For their identification, microscope images are taken at a magnification suitable for observation of expected structural periods, thereby determining the structural period. For example, observations are made at a magnification of 50,000 times if the expected structural period is 0.001 µm or more and less than 0.1 µm, at a magnification of 5,000 times if it is 0.1 µm or more and less than 1 µm, or at a magnification of 100 times if it is 1 µm or more, and the structural period can be estimated form the microscope images obtained.

The sheet according to the present invention is preferably formed of a polymer alloy containing at least two resin components. If the sheet is formed of a polymer alloy containing at least two resin components, it will be easy to form a phase-separated structure, and during the formation of an inorganic substance layer, the structure of the inorganic substance layer may be controlled easily to ensure improved gas barrier properties.

Here, a polymer alloy as referred to above is a multicomponent polymer system that contains at least two resin components. There are no specific limitations on the components of the polymer alloy as long as their combination can serve to form a phase-separated structure, and they may be organic polymers or inorganic polymers. If the dispersed structure of the sheet according to the present invention is a co-continuous type or sea-island type phase-separated structure, it is preferable for the phase-separated structure to be one formed through the spinodal decomposition of at least two resin components. If the phase-separated structure is one formed through the spinodal decomposition, it will be easy to realize the control for ensuring an intended structural size and, during the formation of an inorganic substance layer, the structure of the inorganic substance layer can be controlled easily to provide an inorganic substance-laminated sheet with high gas barrier properties.

Here, the term "the formation of a phase-separated structure through the spinodal decomposition" refers to structural formation through phase separation that occurs in an unstable state inside the spinodal curve in the phase diagram showing the relation of the resin composition of two different components with temperature. For a combination of two different resin components, the difference ($\Delta$Gmix) between the free energy in the case where they are mutually dissolved and the sum of the free energies of the two phases in the case where they are not mutually dissolved is partially differentiated twice by the concentration ($\varphi$) and the curve plotted to the composition and temperature along which the resulting equation ($\partial 2\Delta \text{Gmix}/\partial \varphi 2$) is zero is called the spinodal curve. The mixture is in an unstable state inside the spinodal curve where $\partial 2\Delta \text{Gmix}/\partial \varphi 2 < 0$ whereas $\partial 2\Delta \text{Gmix}/\partial \varphi 2 > 0$ outside the curve.

According to a more detailed theory, when a uniform mixture mutually dissolved first at a temperature in the mutually dissolvable range is rapidly cooled to a temperature in the unstable range, the mixture starts rapid phase separation through spinodal decomposition towards a coexistence composition. During this process, the concentration is monochromatized at a certain wavelength and a co-continuous structure is formed as the two separated phase regions are entangled continuously and regularly with a constant structural period ($\Lambda$m), which is suitable for the formation of a phase-separated structure that is in a fine, uniform state as described above. This formation of a co-continuous structure is followed by a process in which only the difference between the concentrations of both phases increases while the structural period remains constant, and this process is referred as the initial stage of the spinodal decomposition. The initial stage of the spinodal decomposition can be identified in observations made by such techniques as light scattering and X-ray scattering in which the scattering peaks attributed to the periodical structure increase in strength while the values of scattering vectors corresponding to the peak maxima remain constant.

In the spinodal decomposition, this initial stage is followed by an intermediate stage in which both the wavelength and the concentration increase. After the difference in concentration reaches a coexistence composition range, the later stage follows in which the wavelength increases in a self-similar manner, finally leading to macroscopic separation into two phases. As the wavelength increases as the process proceeds from the intermediate stage into the later stage, one of the phases may lose continuity due to the influence of the composition or interface tension, possibly leading to a shift from the co-continuous structure to the sea-island structure described above.

Useful inorganic polymers include inorganic oxides such as those produced by hydrolysis or polymerization reaction of silicon oxides including, for example, tetraalkoxysilanes such as tetramethoxysilane, tetraethoxysilane, tetra-n-propoxysilane, tetra-i-propoxysilane, tetra-n-butoxysilane; trialkoxysilanes such as methyl trimethoxysilane, methyl triethoxysilane, ethyl trimethoxysilane, ethyl triethoxysilane, n-propyl trimethoxysilane, n-propyl triethoxysilane, i-propyl trimethoxysilane, i-propyl triethoxysilane, n-butyl trimethoxysilane, n-butyl triethoxysilane, n-pentyl trimethoxysilane, n-pentyl triethoxysilane, n-hexyl trimethoxysilane, n-heptyl trimethoxysilane, n-octyl trimethoxysilane, vinyl trimethoxysilane, vinyl triethoxysilane, cyclohexyl trimethoxysilane, cyclohexyl triethoxysilane, phenyl trimethoxysilane, phenyl triethoxysilane, 3-chloropropyl trimethoxysilane, 3-chloropropyl triethoxysilane, 3,3,3-trifluoropropyl trimethoxysilane, 3,3,3-trifluoropropyl triethoxysilane, 2-hydroxyethyl trimethoxysilane, 2-hydroxyethyl triethoxysilane, 2-hydroxypropyl trimethoxysilane, 2-hydroxypropyl triethoxysilane, 3-hydroxypropyl trimethoxysilane, 3-hydroxypropyl triethoxysilane, 3-glycidoxypropyl trimethoxysilane, 3-glycidoxypropyl triethoxysilane, 2-(3,4-epoxy cyclohexyl) ethyl trimethoxysilane, 2-(3,4-epoxy cyclohexyl) ethyl triethoxysilane, 3-(meth)acryloxypropyl trimethoxysilane, 3-(meth)acryloxypropyl triethoxysilane, vinyl trimethoxysilane, vinyl triethoxysilane, allyl trimethoxysilane, and vinyl triacetoxysilane; and organoalkoxysilanes such as methyltriacetyl oxysilane and methyl triphenoxysilane.

Useful organic polymers include thermoplastic resins, thermosetting resins, and light curing resins. For example, they include organic polymer compounds such as polyester based resin, polycarbonate resin, acrylic resin, methacrylic resin, polyurethane based resin, polyether based resin, polyepoxy based resin, polyamide based resin (such as nylon and benzoguanamine), ABS resin, polyimide based resin, olefin based resin (such as polyethylene and polypropylene), polystyrene resin, polyvinyl acetate resin, melamine based resin, phenolic resin, resin containing chlorine (Cl) (such as polyvinyl chloride and polyvinylidene chloride), resin containing fluorine (F), silicone based resin, and cellulose based resin, of which at least one is selected from the viewpoint of required characteristics and productivity or a plurality may be mixed in which case it is preferable for the sheet according to the present invention that a bi- or poly-functional crosslinked component be contained.

If a plurality of functional crosslinked components are contained, it will be easy to control the phase-separated structure at an intended structural size and, particularly during the formation of an inorganic substance layer, the structure of the inorganic substance layer can be controlled easily to provide an inorganic substance-laminated sheet with high gas barrier properties.

Such a bi- or poly-functional crosslinked component can be produced by carrying out polymerization reaction (crosslinking reaction) of compounds formed of monomers, oligomers, or polymers having a plurality of reactive functional groups that contribute to polymerization reaction.

Such reactive functional groups include, for example, isopropenyl group, isopentenyl group, allyl group, acryloyl group, methacryloyl group, acryloyloxy group, methacryloyloxy group, methacryl group, acrylamide group, methacrylamide group, allylidene group, allylidyne group, and vinyl ether group; carbon-carbon double bond based groups in which a halogen such as fluorine and chlorine is connected to a carbon (for example, vinyl fluoride group, vinylidene fluoride group, vinyl chloride group, and vinylidene chloride group); carbon-carbon double bond based groups in which a substituent group having an aromatic ring (such as phenyl group and naphthyl group) is connected to a carbon (for example, styryl group); groups having a conjugated polyene structure such as butadienyl group (for example, $CH_2=C(R_1)-C(R_2)=CH-$ and $CH_2=C(R_1)-C(=CH_2)-$ ($R_1$ and $R_2$ denote H or $CH_3$)); polar groups such as hydroxyl group, carboxyl group, phosphoric acid group, amino group, quaternary ammonium salt group, sulfonic acid group, and cyano group; similar polar groups to above, part of which have a counter cation such as $Na^+$ and $K^+$ (for example, $-ONa$, $-COONa$, and $-SO_3Na$); other aromatic groups containing a heterocyclic ring such as lactone, oxazole, and imidazole; ring-opened forms thereof; sulfur-containing functional groups such as epoxy group (including glycidyl group), isocyanate group, and mercaptosulfide; and nitrogen-containing functional groups such as uredo and ketimino. Of these, one or a plurality are selected in consideration of required characteristics and productivity.

Compounds having reactive bi- or poly-functional groups that react to polymerization reaction include, for example, pentaerythritol triacrylate, pentaerythritol trimethacrylate, pentaerythritol tetraacrylate, pentaerythritol tetramethacrylate, pentaerythritol ethoxy triacrylate, pentaerythritol ethoxy trimethacrylate, pentaerythritol ethoxy tetraacrylate, pentaerythritol ethoxy tetramethacrylate, dipentaerythritol triacrylate, dipentaerythritol trimethacrylate, dipentaerythritol tetraacrylate, dipentaerythritol tetramethacrylate, dipentaerythritol pentaacrylate, dipentaerythritol pentamethacrylate, dipentaerythritol hexaacrylate, dipentaerythritol hexamethacrylate, trimethylolpropane triacrylate, trimethylolpropane trimethacrylate, trimethylolpropane ethoxy triacrylate, trimethylolpropane ethoxy trimethacrylate, ditrimethylolpropane triacrylate, ditrimethylolpropane trimethacrylate, ditrimethylolpropane tetraacrylate, ditrimethylolpropane tetramethacrylate, glycerin propoxy triacrylate, and glycerin propoxy trimethacrylate; compounds having a cyclic backbone such as cyclopropane ring, cyclobutane ring, cyclopentane ring, and cyclohexane ring in the molecule (for example, triacrylate, trimethacrylate, tetraacrylate, tetramethacrylate, pentaacrylate, pentamethacrylate, hexaacrylate, and hexamethacrylate); above compounds that are partly modified (for example, those modified with 2-hydroxypropane acid etc. such as 2-hydroxypropane acid-modified pentaerythritol triacrylate, 2-hydroxypropane acid-modified pentaerythritol trimethacrylate, 2-hydroxypropane acid-modified pentaerythritol tetraacrylate, and 2-hydroxypropane acid-modified pentaerythritol tetramethacrylate, and those having a silicone backbone such as silicone triacrylate, silicone trimethacrylate, silicone tetraacrylate, silicone tetramethacrylate, silicone pentaacrylate, silicone pentamethacrylate, silicone hexaacrylate, and silicone hexamethacrylate); compounds having a backbone containing a vinyl group and/or vinylidene group together with another backbone (for example, those having a urethane backbone such as urethane triacrylate, urethane trimethacrylate, urethane tetraacrylate, urethane tetramethacrylate, urethane pentaacrylate, urethane pentamethacrylate, urethane hexaacrylate, and urethane hexamethacrylate; those having an ether backbone such as polyether triacrylate, polyether trimethacrylate, polyether tetraacrylate, polyether tetramethacrylate, polyether pentaacrylate, polyether pentamethacrylate, polyether hexaacrylate, and polyether hexamethacrylate; those having an epoxy-derived backbone such as epoxy triacrylate, epoxy trimethacrylate, epoxy tetraacrylate, epoxy tetramethacrylate, epoxy pentaacrylate, epoxy pentamethacrylate, epoxy hexaacrylate, and epoxy hexamethacrylate; and those having an ester backbone such as polyester triacrylate, polyester trimethacrylate, polyester tetraacrylate, polyester tetramethacrylate, polyester pentaacrylate, polyester pentamethacrylate, polyester hexaacrylate, polyester hexamethacrylate); but the invention is not limited thereto.

For the present invention, sheets (sheet (i) itself in the case of sheet (i) which is a monolayer sheet, and the base and/or substrate layer in the case of sheet (ii) which is a laminate sheet) may contain various additives unless they impair the advantageous effect of the invention. Useful additives include, for example, organic or inorganic fine particles, flame retardant, flame retardation assistant, heat resistance stabilizer, antioxidation stabilizer, leveling agent, slipping agent, antistatic agent, ultraviolet absorber, light stabilization agent, nucleating agent, dye, filler, dispersing agent, and coupling agent.

For the sheet according to the present invention in the form of sheet (ii) which includes a base and a substrate layer having a dispersed structure with a structural period of 0.001 µm to 100 µm laminated on at least one surface thereof, the base may be formed of, for example, resin or glass.

Useful resins for the base include polyesters such as polyethylene terephthalate (PET) and polyethylene naphthalate (PEN); polyolefins such as polyamide, polyimide, polyphenylene sulfide, aramid, polyethylene (PE), and polypropylene (PP); polyvinyl alcohol, polystyrene, polylactic acid, polyvinyl chloride, polycarbonate, polymethyl methacrylate, other acrylic or methacrylic resins, alicyclic acrylic resins, cycloolefin resins (COP), cycloolefin copolymers (COC), triacetyl cellulose (TAC), ABS, polyvinyl acetate, melamine based resins, phenolic resins, polyvinyl chloride, polyvinylidene chloride, other resins containing chlorine (Cl), resins containing fluorine (F), silicone based resins, saponification products of ethylene vinyl acetate copolymer, polyacrylonitrile, and polyacetal.

These resins may be in the form of a single polymer, that is, a homopolymer or a copolymer, or a blend of a plurality thereof, or a mixture and/or copolymer thereof. The glass to be used may be commonly used soda glass.

Furthermore, a plurality thereof may be used in combination. For example, resin and glass may be combined, or a composite resin laminate formed of a plurality of layers of different resins may be used.

The thickness of the base may be 250 µm or less so that the sheet can be rolled up or the thickness may be more than 250 µm. From the viewpoint of cost, productivity, and handleability, it is preferably 250 µm or less, more preferably 150 µm or less, still more preferably 100 µm or less, and particularly preferably 50 µm or less. There are no specific limitations on the lower limit of the thickness of the base, but it is more preferably 5 µm or more, and still more preferably 10 µm or more, from the viewpoint of maintaining a required tensile strength and impact strength.

If a film of such a resin as described above is to be used as base, the resin may be in the form of an unstretched, uniaxially stretched, or biaxially stretched film. Alternatively, it may be a monolayer film, a two or more layered film produced by coextrusion, or a uniaxially or biaxially stretched film.

The surface of the base that is to be laminated with a substrate layer may be pre-treated to ensure good contact by such techniques as corona treatment, ion bombardment treatment, solvent treatment, surface roughening treatment, and formation of an anchor coat layer of an organic substance, inorganic substance, or mixture thereof. In addition, the surface opposite to the one to be laminated with an inorganic substance layer may be coated with an organic substance, inorganic substance, or mixture thereof with the aim of improving the slipping during the winding-up step and decreasing the friction, during the winding-up step, with the inorganic compound layer formed before the winding-up step.

From the viewpoint of moldability, optical characteristics such as transparency, and productivity, useful materials for the base include polyester films of, for example, polyethylene terephthalate or polyethylene naphthalate; films of a mix and/or copolymer of polyethylene terephthalate with polyethylene naphthalate; and others such as polypropylene film, cycloolefin resin film, and cycloolefin copolymer resin film.

There are no specific limitations on the method to be used to produce the sheet according to the present invention (i.e., method for producing sheet (i) in the case where it is sheet (i), that is, a monolayer sheet, or method for producing a substrate layer on the base in the case where it is sheet (ii), that is, a laminate sheet), but it is preferable for the process of their production to contain a step in which the components to constitute sheet (i) or the components to constitute the substrate layer to form a phase-separated structure via a mutually dissolved state during the formation of sheet (i) or the substrate layer, respectively. Here, a mutually dissolved state is one in which at least two resin components contained are in the form of a mixture uniformly mixed at the molecular level and more specifically, in the form of a mixture free from phase-separated structures of 0.001 µm or more that contain two different resin components. If such a step is contained, it will be easy to control the dispersed structure at an intended structural size and, during the formation of an inorganic substance layer, the structure of the inorganic substance layer can be controlled easily to provide an inorganic substance-laminated sheet with high gas barrier properties.

In the case of sheet (i), methods containing such a step include, for example, molding a mixture composition containing the components of the sheet by thermal melting to form a phase-separated structure, and in the case of substrate layer formation for sheet (ii), they include preparing a coating liquid containing the components of the substrate layer and coating the base with it by a generally known technique such as casting, spin casting, dip casting, bar coating, spraying, blade casting, slit die coating, gravure coating, reverse coating, screen printing, die coating, printing transfer, ink jetting, and other wet coating techniques, followed by performing a method as described later for polymerizing the components of the substrate layer to form a phase-separated structure in the substrate layer. Of the coating methods for forming a substrate layer for sheet (ii), preferable ones include wet coating techniques that use micro gravure coating or slit die coating because they serve to form a uniform substrate layer with high productivity.

Furthermore, the mixture composition that contains the components of sheet (i) in the case where the sheet is sheet (i) (hereinafter occasionally referred to as mixture composition) and the coating liquid that contains the components of the substrate layer in the case where the sheet is sheet (ii) (hereinafter occasionally referred to as coating liquid) may contain a solvent with the aim of ensuring uniform mutual dissolution of the components of sheet (i) and the components of the substrate layer, respectively. To prepare a solvent-containing mixture composition or coating liquid, it is first applied by a method as listed above and then dried at a temperature where the solvent can be volatilized while maintaining the mutually dissolved state of the components of sheet (i) or the components constituting the substrate layer, followed by polymerizing the components of sheet (i) or the components of the substrate layer in the same way as for the solvent-free case, thereby forming a phase-separated structure in sheet (i) or the substrate layer.

There are no specific limitations on the solvent to be used for these cases as long as it can be mutually dissolved with the components of sheet (i) or the components of the substrate layer and an appropriate one may be selected to meet the components of sheet (i), the components of the substrate layer, and the production method to be adopted. Useful ones include, for example, acetate esters such as ethyl acetate and butyl acetate; ketones such as acetone, acetophenone, ethyl methyl ketone, and methyl isobutyl ketone; aromatic hydrocarbons such as toluene, xylene, and benzyl alcohol; alcohols such as methanol, ethanol, 1,2-propanediol, terpineol, acetyl terpineol, butyl carbitol, ethyl cellosolve, ethylene glycol, triethylene glycol, tetraethylene glycol, and glycerol; ethylene glycol monoalkyl ethers such as triethylene glycol monobutyl ether; and others such as ethylene glycol dialkyl ethers, diethylene glycol monoalkyl ether acetates, ethylene glycol monoaryl ethers, polyethylene glycol monoaryl ethers, propylene glycol monoalkyl ethers, dipropylene glycol dialkyl ethers, propylene glycol monoalkyl ether acetates, ethylene carbonate, propylene carbonates, γ-butyrolactone, solvent naphtha, water, N-methyl pyrolidone, dimethyl sulfoxide, hexamethylphosphoric triamide, dimethyl ethylene urea, N,N'-dimethyl propylene urea, and tetramethyl urea, of which two or more may be contained.

To form a phase-separated structure in sheet (i) or the substrate layer, available curing methods include the addition of external energy such as heating, but it is more preferable to use electromagnetic waves or particle beams for forming a phase-separated structure. The use of electromagnetic waves or particle beams allows a phase-separated structure to be formed easily via a mutually dissolved state of the components constituting sheet (i) or the components constituting the substrate layer and accordingly, the phase-separated structure will be controlled easily at an intended structure size, thereby making it easy to control the structure of the inorganic substance layer during the formation of the inorganic substance layer so that an inorganic substance-laminated sheet with high gas barrier properties will be obtained easily.

Useful electromagnetic waves include γ ray, X ray, ultraviolet ray, visible ray, infrared ray, and microwave, while useful particle beams include α ray, β ray, electron beam, proton beam, and neutron beam, of which two or more may be combined depending on the type and properties of the components constituting sheet (i) or the components constituting the substrate layer, but it is preferable to add an initiator to allow the electromagnetic waves or particle beams to work efficiently to promote the polymerization reaction and curing reaction of the components constituting sheet (i) or the components constituting the substrate layer.

Here, an initiator is a substance that absorbs electromagnetic waves or particle beams and initiates a chemical reaction by producing an active species such as radical species, cationic species, and anionic species that can work to start such reactions. If an initiator is contained, the irradiation with electromagnetic waves or particle beams can cause the development of a species that works to start the polymerization reaction and curing reaction throughout the system, leading to the shortening of the time period required to start the curing or the shortening of the curing time. It also allows a phase-separated structure to be formed easily via a mutually dissolved state of the components constituting sheet (i) or the components constituting the substrate layer and accordingly, the phase-separated structure will be controlled easily at an intended structure size, thereby making it easy to control the structure of the inorganic substance layer during the formation of the inorganic substance layer so that an inorganic substance-laminated sheet with high gas barrier properties will be obtained easily.

Effective initiators include, for example, benzophenone based ones such as benzophenone, hydroxybenzophenone, and 4-phenyl benzophenone; benzoin based ones such as benzyl dimethyl ketal; α-hydroxyketone based or α-aminoketone based ones such as 1-hydroxy-cyclohexyl-phenyl-ketone, 2-hydroxy-2-methyl-1-phenyl propane-1-one, 2-methyl 1-[4-(methylthio)phenyl]-2-morpholinopropane-1-one, and 2-benzyl-2-dimethyl amino-1-(4-morpholinophenyl)-butanone-1; thioxanthone based ones such as isopropyl thioxanthone and 2-4-diethyl thioxanthone; and methyl phenyl glyoxylate. Of these initiators, one or a plurality in combination may be used in consideration of their maximum absorption wavelength, absorbance, color, and degree of pigmentation.

Commercial products of such photopolymerization initiators include IRGACURE 184 (manufactured by BASF), a product of 1-hydroxy-cyclohexyl-phenyl-ketone, IRGACURE 907 (manufactured by BASF), a product of 2-methyl 1-[4-(methylthio)phenyl]-2-morpholinopropane-1-one, and IRGACURE 369 (manufactured by BASF), a product of 2-benzyl-2-dimethylamino-1-(4-morpholinophenyl)-butanone-1, of which one or a combination of two or more in different absorption wavelength ranges may be adopted in consideration of the type and properties of the components of the sheet.

In addition, it is effective to control or adjust the cumulative exposure dose by such techniques as changing the conditions (output conditions etc.) of the irradiation source such as lamp that is used for irradiation with electromagnetic waves or particle beams, changing the irradiation distance between the irradiation source and the irradiated body, and adjusting the conveyance speed of the irradiated body required to produce the sheet according to the present invention in order to shorten the irradiation time. It is also effective to perform the irradiation with electromagnetic waves or particle beams in an atmosphere filled with an inert gas such as nitrogen and argon or in an atmosphere with a specific low oxygen concentration such as a deoxygenized atmosphere. These may be combined appropriately to ensure effective sheet formation.

In the case of sheet (ii), the thickness of the substrate layer is preferably 50 nm or more and 10 μm or less. If it is less than 50 nm, an inorganic substance-laminated sheet with high gas barrier properties may not be obtained as a result of influence of the surface irregularities of the base. If it is more than 10 μm, the substrate layer may suffer a large stress to cause warp of the base and cracks in the inorganic substance layer, possibly making it impossible to obtain an inorganic substance-laminated sheet with high gas barrier properties. Here, the thickness of the substrate layer can be determined from cross-sectional images observed by transmission electron microscopy (TEM) or scanning electron microscopy (SEM).

[Inorganic Substance Layer]

The inorganic substance-laminated sheet according to the present invention can be realized by controlling the structure of an inorganic substance layer by using a sheet so that the inorganic substance-laminated sheet show high gas barrier properties. Here, it may have a multi-layered laminated structure produced by laminating a substrate layer and an inorganic substance layer repeatedly on the inorganic substance layer formed above. Furthermore, such an inorganic substance layer may be disposed only on one side of the sheet or an inorganic substance layer may be formed on each side of the sheet in such a case where warp or deformation is caused as a result of a poor stress balance between the surface with an inorganic substance layer and the opposite surface. It is particularly preferable for the inorganic substance-laminated sheet according to the present invention to have such gas barrier properties as represented by a water vapor transmittance of 1 g/(m²·24 h·atm) or less at a temperature of 40° C. and a humidity of 90% RH.

The inorganic substance layer for the present invention preferably has a thickness of 10 nm or more, more preferably 50 nm or more. If the inorganic substance layer has a thickness of less than 10 nm, a sufficiently high degree of gas barrier properties may not be maintained at some positions, leading to problems such as uneven gas barrier properties in the plane of the inorganic substance-laminated sheet. The inorganic substance layer for the present invention preferably has a maximum thickness of 2,000 nm or less, more preferably 1,000 nm or less. If the thickness of the inorganic substance layer is more than 2,000 nm, a large residual stress will take place in the film, and cracks will be generated easily in the inorganic substance layer under bending and external impact, possibly leading to deterioration in the gas barrier properties in the course of long-term use.

There are no specific limitations on the inorganic compounds to be used to produce the inorganic substance layer, and either only inorganic substances or a mixture of an organic substance and an inorganic substance may be adopted, but it is preferable to adopt one or at least one element that belongs to any of the 1st to 17th groups in the 2nd to 6th rows of the periodic table in order to allow the sheet according to the present invention to develop good effects easily, particularly to develop improved gas barrier properties. Specifically, useful substances to be contained in the inorganic substance layer include, for example, silicon (Si), aluminum (Al), zinc (Zn), titanium (Ti), zirconium (Zr), tin (Sn), indium (In), niobium (Nb), molybdenum (Mo), tantalum (Ta), and palladium (Pd). In the inorganic substance layer, these substances may be present in their elementary forms or may be present in the form of compounds such as carbide, oxide, nitride, or sulfide or as a mixture thereof.

Described below is the case with silicon (Si) as an example of the elements present in the inorganic substance layer. There are many compounds of silicon including silicon oxides such as silicon dioxide ($SiO_2$) and silicon nitrides such as nitride silicon ($Si_3N_4$), of which silicon oxides are used preferably.

In regard to the composition of the silicon oxides, it is preferable for the sheet to contain silicon oxides in which the ratio of the number of oxygen atoms to that of the silicon atoms is 1.5 to 2.0. If the ratio of the number of oxygen atoms to that of the silicon atoms is more than 2.0, the oxygen atoms contained account for an excessively large proportion and accordingly, the volume occupied by voids and defects will increase, possibly making it impossible to obtain an inorganic substance-laminated sheet with improved gas barrier properties. If the ratio of the number of oxygen atoms to that of the silicon atoms is less than 1.5, on the other hand, the number of oxygen atoms will be small and accordingly, the sheet will have dense properties, but may be too low in flexibility, possibly allowing cracks to be easily developed under heat or external stress. Thus, the ratio of the number of oxygen atoms to that of the silicon atom is more preferably in the range of 1.7 to 1.9.

To determine the composition of a silicon compound, the content of the atoms of each element can be determined by applying X-ray photoelectron spectroscopy (XPS), ICP emission spectroscopy, and Rutherford backscattering analysis depending on the composition. If another resin layer exists on the inorganic substance layer, the surface laminar portion with a thickness determined by the X-ray reflectivity technique is removed by ion etching or chemical treatment, and analysis is performed thereafter.

There are no specific limitations on the method to be used to produce an inorganic substance layer that contains a silicon compound, and useful techniques for production thereof include, for example, vacuum deposition, sputtering, ion plating, chemical vapor deposition (abbreviated as CVD), and the aforementioned wet coating technique that uses a coating liquid containing a silicon compound. In the case of vacuum deposition, it is preferable that a deposition material that is low in melting point and contains elements with small atomic radii be used and that the deposition be performed in an environment under highly reduced pressure. In the case of sputtering, a dense, thin film is produced through surface diffusion of particles to constitute the film and accordingly, it is preferable to adopt the plasma assisted sputtering technique that performs a thin film production process in which plasma of a reactive gas such as oxygen gas and carbon dioxide gas is used for assisting the process at the sheet surface, in addition to the plasma that works for sputtering the target material. In the case of CVD, it is preferable to perform a process in which a silicon-based compound monomer in a gas state is activated by high-intensity plasma so that a dense silicon-based thin film layer is formed through a polymerization reaction. Of these techniques, the use of sputtering or CVD is more preferable.

Useful silicon-based compounds to be applied to CVD include, for instance, silane, methyl silane, dimethyl silane, trimethyl silane, tetramethyl silane, ethyl silane, diethyl silane, triethyl silane, tetraethyl silane, propoxy silane, dipropoxy silane, tripropoxy silane, tetrapropoxy silane, dimethyl disiloxane, tetramethoxy silane, tetraethoxy silane, tetrapropoxy silane, tetramethyl disiloxane, hexamethyl disiloxane, tetramethoxy silane, tetraethoxy silane, tetrapropoxy silane, hexamethyl cyclotrisiloxane, octamethyl cyclotetrasiloxane, decamethyl cyclopentasiloxane, undecamethyl cyclohexasiloxane, dimethyl disilazane, trimethyl disilazane, tetramethyl disilazane, hexamethyl disilazane, hexamethyl cyclotrisilazane, octamethyl cyclotetrasilazane, decamethyl cyclopentasilazane, and undecamethyl cyclohexasilazane. Of these, hexamethyl disiloxane and tetraethoxysilane are preferable from the viewpoint of safety in handling.

Described next below is the case with zinc (Zn) as another example of the elements present in the inorganic substance layer. Useful zinc compounds include zinc oxide (ZnO) and zinc sulfide (ZnS). The zinc compound used for the present invention preferably accounts for 50 mass % or more, more preferably 60 mass % or more, and still more preferably 80 mass % or more, of the entire inorganic substance layer.

It should be noted that the zinc compound is regarded as one that is represented by a composition formula in which the composition ratio among the elements, which may be identified by a method as described below such as X-ray photoelectron spectroscopy (XPS), ICP emission spectroscopy, and Rutherford backscattering analysis, consists only of integers. For example, even in the case where the composition ratio of ZnS, ZnO, etc. slightly differs from the stoichiometric mixture ratio depending on the production conditions, the compounds are assumed to be ZnS, ZnO, etc. in calculating the aforementioned mass content.

There are no specific limitations on the method to be used for forming the inorganic substance layer containing a zinc compound, and useful formation methods include, for example, vacuum deposition, sputtering, ion plating, and CVD. Of these methods, sputtering is preferable as a layer formation method in a simple, low-cost process.

As long as containing zinc, the inorganic substance layer containing a zinc compound may further contain elementary substances such as silicon (Si), aluminum (Al), titanium (Ti), zirconium (Zr), tin (Sn), indium (In), niobium (Nb), molybdenum (Mo), tantalum (Ta), and palladium (Pd), and compounds such as carbides, oxides, nitrides, and sulfides, which may be present singly or in combination of a plurality thereof, but the inorganic compound used for present invention is preferably one containing a zinc compound and a silicon oxide in order to provide an inorganic substance-laminated sheet having high gas barrier properties. For example, preferred layers that serve for achieving high gas barrier properties include those composed of a phase in which zinc oxide, silicon dioxide, and aluminum oxide coexist (hereinafter referred to as [inorganic A] layer) and those composed of a phase in which zinc sulfide and silicon dioxide coexist (hereinafter referred to as [inorganic B] layer). (Details of the [inorganic A] layer and the [inorganic B] layer will be described later.)

[Layer of a Coexisting Phase in which Zinc Oxide, Silicon Dioxide, and Aluminum Oxide Coexist: Inorganic A-Layer]

Described below is the layer ([inorganic A] layer) that includes a coexistence phase of zinc oxide, silicon dioxide, and aluminum oxide and serves favorably as the inorganic substance layer for an embodiment of the present invention. Hereinafter, the coexistence phase of zinc oxide, silicon dioxide, and aluminum oxide is occasionally referred to simply as $ZnO$—$SiO_2$—$Al_2O_3$. In regard to silicon dioxide ($SiO_2$), a substance having a composition ratio slightly differing from that based on the silicon-oxygen ratio in the above composition (between SiO and $SiO_2$) may result depending on the production conditions adopted, but such a substance is herein referred to as silicon dioxide or $SiO_2$ and assumed to have a composition as expressed by the molecular formula. For zinc oxide and aluminum oxide as well, such a difference in the composition ratio from the chemical formula is treated in the same manner, and they are herein referred to as zinc oxide or ZnO, and aluminum oxide or $Al_2O_3$, respectively, and assumed to have compositions as expressed by the chemical formulae regardless of the shifts in their composition ratios that may occur depending on the production conditions.

In the phase in which zinc oxide, silicon dioxide, and aluminum oxide coexist, the coexistence of a crystalline component contained in the zinc oxide and an amorphous component of the silicon dioxide acts to depress the crystal growth of the zinc oxide, which otherwise tends to form crystallites easily, leading to the formation of particles with small diameters and, in turn, a dense layer, which would depress the penetration of oxygen and water vapor. This is considered to be the reason why the existence of the [inorganic A] layer in the inorganic substance-laminated sheet for the present invention serves to ensure improved gas barrier properties.

It is also inferred that the coexistence of aluminum oxide acts to further prevent the crystal growth as compared with the case of the coexistence of only zinc oxide and silicon dioxide, thereby depressing the deterioration in gas barrier properties attributable to the formation of cracks.

The composition of the [inorganic A] layer can be determined by ICP emission spectroscopy analysis as described later. The atom concentration determined by ICP emission spectroscopy analysis is preferably 20 to 40 atom % for the Zn atom, 5 to 20 atom % for the Si atom, 0.5 to 5 atom % for the Al atom, and 35 to 70 atom % for the O atom.

If the Zn atom concentration is more than 40 atom % or if the Si atom concentration is less than 5 atom %, there will be a lack of oxides that can serve to depress the crystal growth of zinc oxide and the volume occupied by gaps and defects will increase, possibly making it difficult to develop gas barrier properties adequately. If the Zn atom concentration is less than 20 atom % or if the Si atom concentration is more than 20 atom %, the amorphous component of silicon dioxide in the layer will account for an increased proportion, possibly leading to a layer with decreased flexibility and rapid formation of cracks under heat or external stress. If the Al atom concentration is more than 5 atom %, the affinity between zinc oxide and silicon dioxide will be excessively high, possibly leading to rapid formation of cracks under heat or external stress. If the Al atom concentration is less than 0.5 atom %, the affinity between zinc oxide and silicon dioxide will not be sufficiently high, and accordingly, the binding force among the particles forming the layer will not be increased, possibly leading to decreased flexibility and rapid formation of cracks under heat or external stress. If the O atom concentration is more than 70 atom %, the quantity of defects in the [inorganic A] layer will increase, possibly leading to a failure to realize required gas barrier properties. If the O atom concentration is less than 35 atom %, zinc, silicon, and aluminum will not be in a sufficiently oxidized state, and accordingly, the crystal growth will not be depressed, leading to particles with large diameters and possibly resulting in deterioration in gas barrier properties. In view of these points, the atom concentration is preferably 25 to 35 atom % for the Zn atom, 10 to 15 atom % for the Si atom, 1 to 3 atom % for the Al atom, and 50 to 64 atom % for the O atom.

There are no specific limitations on the components contained in the [inorganic A] layer as long as zinc oxide, silicon dioxide, and aluminum oxide account for a primary part in the aforementioned composition range, and it may further contain elementary substances such as silicon (Si), aluminum (Al), zinc (Zn), titanium (Ti), zirconium (Zr), tin (Sn), indium (In), niobium (Nb), molybdenum (Mo), tantalum (Ta), and palladium (Pd), and compounds such as carbides, oxides, nitrides, and sulfides, which may be present singly or in combination of a plurality thereof. Here, the term "primary" means that the components accounts for 50 mass % or more, preferably 60 mass % or more, still more preferably 80 mass % or more, of all the components of the [inorganic A] layer.

The [inorganic A] layer has a composition similar to that of the mixed sintered material used for producing the layer, and accordingly, the composition of the [inorganic A] layer can be optimized by using a mixed sintered material having a composition similar to that of the intended layer.

For the composition analysis of the [inorganic A] layer, quantitative analysis of each element of zinc, silicon, and aluminum is performed by ICP emission spectroscopy, thereby determining the composition ratio of zinc oxide, silicon dioxide, aluminum oxide, and other inorganic oxides contained. Calculation for the oxygen atom is carried out on the assumption that the zinc atom, silicon atom, and aluminum atom exist in the form of zinc oxide (ZnO), silicon dioxide ($SiO_2$), and aluminum oxide ($Al_2O_3$), respectively.

ICP emission spectroscopy analysis can perform simultaneous multi-element examination based on the luminescence emission spectrum observed when a specimen is introduced along with argon gas to a plasma source, and can be applied to composition analysis. If another resin layer exists on the inorganic substance layer, the surface laminar portion with a thickness determined by the X-ray reflectivity technique is removed by ion etching or chemical treatment, and ICP emission spectroscopy analysis is performed thereafter.

There are no specific limitations on the method to be used to form the [inorganic A] layer on sheet (i) or on the substrate layer of sheet (ii), and an appropriate layer can be produced by vacuum deposition, sputtering, or ion plating of a mixed sintered material of zinc oxide, silicon dioxide, and aluminum oxide. In the case where separate materials of zinc oxide, silicon dioxide, and aluminum oxide are used, zinc oxide, silicon dioxide, and aluminum oxide are deposited or sputtered simultaneously from separate deposition sources or sputtering electrodes to produce a mixture film with an intended composition. Of these methods, sputtering using a mixed sintered material is preferably adopted for forming the [inorganic A] layer for the present invention from the viewpoint of the gas barrier properties and the composition reproducibility for the layer to be formed.

[Layer of a Phase in which Zinc Sulfide and Silicon Dioxide Coexist: Inorganic B-Layer]

Described below is the layer ([inorganic B] layer) that includes a coexistence phase of zinc sulfide and silicon dioxide and serves favorably as the inorganic substance layer for the present invention. Hereinafter, the coexistence phase of zinc sulfide and silicon dioxide is occasionally referred to as $ZnS$—$SiO_2$. In regard to silicon dioxide ($SiO_2$), a substance having a composition ratio slightly differing from that based on the silicon-oxygen ratio in the above composition (between SiO and $SiO_2$) may result depending on the production conditions adopted, but such a substance is herein referred to as silicon dioxide or $SiO_2$ and assumed to have a composition as expressed by the molecular formula. For zinc sulfide as well, such a difference in the composition ratio from the chemical formula is treated in the same manner, and it is herein referred to as zinc sulfide or ZnS, and assumed to have a composition as expressed by the chemical formula regardless of the differences in the composition ratio that may occur depending on the production conditions.

In the phase in which zinc sulfide and silicon dioxide coexist, the coexistence of a crystalline component contained in the zinc sulfide and an amorphous component contained in the silicon dioxide acts to depress the crystal growth of the zinc sulfide, which tends to form crystallites easily, leading to the formation of particles with small diameters and, in turn, a dense layer, which would depress the penetration of oxygen and water vapor. This is considered to be the reason why the existence of the [inorganic B] layer in the inorganic substance-laminated sheet for the present invention serves to improve the gas barrier properties. It is also considered that the coexisting zinc sulfide and silicon dioxide phase containing a zinc sulfide component with a depressed crystal growth rate is higher in flexibility than a layer composed only of an inorganic oxide or metal oxide and less liable to cracks under heat or external stress, thus allowing the [inorganic B] layer to serve to depress the deterioration in gas barrier properties that is attributed to the formation of cracks.

In regard to the [inorganic B] layer, zinc sulfide accounts for a mole fraction of 0.7 to 0.9 of the total quantity of zinc sulfide and silicon dioxide. If zinc sulfide accounts for a mole fraction of more than 0.9 of the total quantity of zinc sulfide and silicon dioxide, there will be a lack of oxides that can depress the crystal growth of zinc sulfide and the volume occupied by gaps and defects will increase, possibly making it difficult to develop required gas barrier properties. If zinc sulfide accounts for a mole fraction of less than 0.7 of the total quantity of zinc sulfide and silicon dioxide, the quantity of the amorphous component of silicon dioxide in the [inorganic B] layer will increase and the layer will decrease in flexibility, possibly leading to rapid formation of cracks under heat or external stress. It is more preferable for the zinc sulfide to account for a mole fraction of 0.75 to 0.85 of the total quantity of zinc sulfide and silicon dioxide.

There are no specific limitations on the components contained in the [inorganic B] layer as long as zinc sulfide and silicon dioxide accounts for a primary part in the aforementioned composition range, and it may further contain elementary substances such as silicon (Si), aluminum (Al), zinc (Zn), titanium (Ti), zirconium (Zr), tin (Sn), indium (In), niobium (Nb), molybdenum (Mo), tantalum (Ta), and palladium (Pd), and compounds such as carbides, oxides, nitrides, and sulfides, which may be present singly or in combination of a plurality thereof. Here, the term "primary" means that the components accounts for 50 mass % or more, preferably 60 mass % or more, still more preferably 80 mass % or more, of all the components of the [inorganic B] layer.

The [inorganic B] layer has a composition similar to that of the mixed sintered material used for producing the layer, and accordingly, the composition of the [inorganic B] layer can be optimized by using a mixed sintered material having a composition that meets the objective.

Composition analysis of the [inorganic B] layer can be carried out by first determining the contents of zinc and silicon by ICP emission spectroscopy, and applying the results to quantitative analysis of each element by the Rutherford backscattering technique to determine the contents of zinc sulfide, silicon dioxide, and other inorganic oxides contained. ICP emission spectroscopy analysis can perform simultaneous multi-element examination based on the luminescence emission spectrum observed when a specimen is introduced along with argon gas to a plasma source, and can be applied to composition analysis. Furthermore, the Rutherford backscattering technique can accelerate charged particles at a high voltage, apply them to a specimen, and identify the species and determine the quantities of the elements involved from the number and energy of the charged particles rebounded from the specimen, thereby determining the composition ratio of each element. Here, since the [inorganic B] layer is a composite layer of a sulfide and an oxide, analysis is performed by the Rutherford backscattering technique which can analyze the contents of sulfur and oxygen. If another resin layer exists on the inorganic substance layer, the surface laminar portion with a thickness determined by the X-ray reflectivity technique is removed by ion etching or chemical treatment, and ICP emission spectroscopy analysis and Rutherford backscattering analysis are performed thereafter.

There are no specific limitations on the method to be used to form the [inorganic B] layer on sheet (i) or on the substrate layer of sheet (ii), and an appropriate layer can be produced by vacuum deposition, sputtering, or ion plating of a mixed sintered material of zinc sulfide and silicon dioxide. In the case where separate materials of zinc sulfide and silicon dioxide are used, zinc sulfide and silicon dioxide are deposited or sputtered simultaneously from separate deposition sources or sputtering electrodes to produce a mixed film with an intended composition. Of these methods, sputtering using a mixed sintered material is preferably adopted for forming the [inorganic B] layer for the present invention from the viewpoint of the gas barrier properties and the composition reproducibility for the layer to be formed.

[Typical Applications]

The inorganic substance-laminated sheet according to the present invention can be applied to electronic devices including solar batteries and displays.

For solar batteries, it can be used suitably as sealing members in silicon based solar batteries, compound based solar batteries, and organic solar batteries. Having high gas barrier properties and strong adhesiveness, the inorganic substance-laminated sheet according to the present invention may be pasted to PET resin film or fluorine resin film in the back sheet of a solar battery to allow the back sheet to have largely improved barrier properties against water vapor, leading to large improvement in durability of the back sheet and that of the solar battery.

It can be also used suitably as sealing members of touch panels, electronic paper, liquid crystal displays, organic EL displays, and organic EL lighting devices in display systems. When applied to touch panels, the inorganic substance-laminated sheet according to the present invention may be pasted to transparent, electrically conductive film composed of a stack of ITO and other layers with the aim of improving the gas barrier properties of the transparent, electrically conductive film, thereby serving to prevent the transparent, electrically conductive film from being degraded by water vapor.

When used as sealing members of electronic paper, liquid crystal displays, organic EL displays, organic EL lighting devices, etc., particularly those of, for example, film-based flexible electronic paper, liquid crystal displays, organic EL displays, organic EL lighting devices, etc., the inorganic substance-laminated sheet according to the present invention may be pasted to the transparent, electrically conductive film, diffusion film, polarizing plate, etc., of these products or bonded with an adhesive or a sticking agent to some parts of or the entire surfaces of organic EL elements in order to develop high gas barrier properties and also develop flexible properties, thereby serving to improving the durability and lengthening the operating life of such flexible electronic paper, liquid crystal displays, organic EL displays, organic EL lighting devices, etc.

EXAMPLES

The invention is described specifically below with reference to Examples. It should be noted that the present invention should not be construed as limited to the examples given below.

[Evaluation Methods]

First, the evaluation methods used in Examples and Comparative examples are described. Each test procedure was carried out five times (n=5) and the measurements were averaged unless otherwise specified.

(1) Thickness of Sheet (i), Base, Substrate Layer, and Inorganic Substance Layer Specimens for cross-sectional observation were prepared by the FIB technique using Microsampling System (FB-2000A, manufactured by Hitachi, Ltd.) (specifically, according to the procedure described in "Kobunshi Hyomen Kakogaku" (Polymer Surface Processing), Satoru lwamori, pp. 118-119). A transmission electron microscope (H-9000UHR II, manufactured by Hitachi, Ltd.) was used at an accelerating voltage of 300 kV and the cross section of a specimen prepared for observation was examined to determine the thickness of each member.

(2) Water Vapor Permeability

Measurements were made by using a water vapor permeability measuring machine (model: Deltaperm (registered trademark)) manufactured by Technolox U.K., under the conditions of a temperature of 40° C., humidity of 90% RH, and measuring area of 50 cm$^2$. Two specimens were sampled for each test, and ten measurements were made for each specimen and averaged to provide a value to represent its water vapor permeability.

(3) Composition of [Inorganic A] Layer

The composition of the [inorganic A] layer was analyzed by ICP emission spectroscopy (SPS4000, manufactured by SII NanoTechnology Inc.). The contents of the zinc atom, silicon atom, and aluminum atom in a specimen were measured, and converted to the ratio in the number of atoms. Calculation for the oxygen atom was carried out on the assumption that the zinc atom, silicon atom, and aluminum atom exist in the form of zinc oxide (ZnO), silicon dioxide ($SiO_2$), and aluminum oxide ($Al_2O_3$), respectively.

(4) Composition of [Inorganic B] Layer

The composition of the [inorganic B] layer was analyzed by ICP emission spectroscopy (SPS4000, manufactured by Seiko Electronics & Instruments Ltd.) was performed, and the results were analyzed by the Rutherford backscattering technique (AN-2500, manufactured by Nissin High Voltage Co., Ltd.) for quantitative analysis of each element to determine the contents of zinc sulfide and silicon dioxide.

(5) Compositions of Inorganic Substance Layers (Other than [Inorganic A] and [Inorganic B] Layers)

The inorganic compound was examined by X-ray photoelectron spectroscopy (XPS) to determine the ratio of the number of metal atoms or nonmetal atoms contained to the number of oxygen atoms and the ratio of the number of oxygen atoms to the number of silicon atoms (0/Si ratio), and the characteristics described in sections (3) and/or (4) were also measured as required.

The measuring conditions used were as described below.
Equipment: Quantera SXM (manufactured by PHI)
Excited X-ray: monochromatic Al Kα1, 2
X-ray diameter: 100 μm
Photoelectron take-off angle: 10°

(6) Identification of Dispersed Structure (Existence or Absence of Dispersed Structure, Shape of Phase-Separated Structure) in Sheet Surface (Surface of Sheet (i) or Surface of Substrate Layer)

The surface of a sheet was observed at an appropriate magnification by a field emission type scanning electron microscope (JSM-6301NF, manufactured by JEOL) at an accelerating voltage of 5 kV and an emission current of 12 μA to check for a dispersed structure and examine the shape of the phase-separated structure. The appropriate magnification described above is 50,000 times if the expected structural period is 0.001 μm or more and less than 0.1 μm, 5,000 times if it is 0.1 μm or more and less than 1 μm, and 1,000 times if it is 1 μm or more.

The structure was considered to be in a mutually dissolved state if no phase-separated structure was seen in the resulting electron microscope image while it was considered to be in a co-continuous state if two or more continuous phases were found to be entangled in the structure. It was considered to be in a sea-island state if one phase was in the form of particles while the other phase was in the form of matrix, with the particles being scattered in the matrix. Here, if no phase-separated structure was found at an appropriate magnification as specified above, the magnification was increased one step at a time, and it was concluded that no phase-separated structure was present if no phase-separated structure was found up to a magnification of 50,000 times.
(7) Structural Period of Dispersed Structure in Sheet The surface of a sheet (surface of sheet (i) or surface of substrate layer) was observed by the same method as in paragraph (6) and those samples which were found to contain a dispersed structure were examined as described below to determine the structural period of the dispersed structure. Here, the length referred to herein is the real distance and the real distance was measured based on the scale bar shown in the microphotograph.
(7-1) Cases where the Dispersed Structure is a Sea-Island Type Phase-Separated Structure Method A was used in Examples A1 to A23 and Comparative examples A1 to A5 and method B was used in Examples B1 to B23 and Comparative examples B1 to B5.
(7-1-1) Method A In the case where the dispersed structure was a sea-island type phase-separated structure, an arbitrary area that contained 10 or more and less than 100 regions of island phase B was selected in an electron microscope photograph, and 10 straight lines were drawn in the area in such a manner that each of the lines intersected 20 or more and less than 200 boundaries between phase A and phase B to identify the intersections between the straight lines and the phase interfaces. The distances between adjacent intersections were measured for each of the 10 straight lines, and the number average of the measurements was taken as structural period. Here, observation was performed at magnifications as specified in paragraph (6).
(7-1-2) Method B In the case where the dispersed structure was a sea-island type phase-separated structure, three arbitrary areas each containing 10 or more and less than 100 regions of island phase B were selected in an electron microscope photograph, and the number average of the measurements of the size of the island phase B regions in the areas was calculated to represent the structural period. Here, the size of an island phase B region is the length of the shortest straight line connecting a point on the phase interface to another point on the phase interface through the gravity center of the island phase region.
(7-2) Cases where the Dispersed Structure is a Co-Continuous Type Phase-Separated Structure The method described below was used commonly in Examples A1 to A23, Comparative examples A1 to A5, Examples B1 to B23, and Comparative examples B1 to B5.

In the case where the dispersed structure was a phase A/phase B co-continuous type phase-separated structure, 10 straight lines were drawn at random in a square electron microscopic photograph, followed by identifying the intersections between the straight lines and the phase interfaces. Then, the distances between adjacent intersections were measured, and the number average of the measurements was taken as structural period. Here, the straight lines were drawn in such a manner that each made 20 or more and less than 200 intersections with the boundaries between phase A regions and phase B regions. Observation was performed at magnifications as specified in paragraph (6).
(8) Identification of Sheet Components (Components of Sheet (i) and Components of Substrate Layer)

A sheet sample was dissolved in a solvent that can dissolve it (sheet (i) or substrate layer). Subsequently, each component was separated as required by, for example, a generally known chromatographic technique such as silica gel column chromatography, gel permeation chromatography, and high performance liquid chromatography, followed by purification and qualitative analysis.

Furthermore, the sheet components (components of sheet (i) or components of the substrate layer) were condensed or diluted appropriately for sample preparation. Then, evaluation methods as described below was carried out to identify the components contained in the sample.

For the analysis, analysis methods as described below were used in combination in such a manner that the smallest number thereof were combined as long as effective analysis would be ensured.

Useful methods include magnetic nuclear resonance spectroscopy ($^1$H-NMR, $^{13}$C-NMR, $^{29}$Si-NMR, $^{19}$F-NMR), two-dimensional magnetic nuclear resonance spectroscopy (2D-NMR), infrared spectrophotometry (IR), Raman spectroscopy, various mass spectrometry techniques (gas chromatography mass spectrometry (GC-MS), pyrolysis gas chromatography mass spectrometry (pyrolysis GC-MS), matrix-assisted laser desorption/ionization mass spectrometry (MALDI-MS), time-of-flight mass spectrometry (TOF-MS), matrix-assisted laser desorption/ionization time-of-flight mass spectrometry (MALDI-TOF-MS), dynamic secondary ion mass spectrometry (dynamic-SIMS), time-of-flight secondary ion mass spectrometry (TOF-SIMS), other static secondary ion mass spectrometry techniques (Static-SIMS), and the like), X-ray diffraction (XRD), neutron diffraction (ND), low energy electron diffraction (LEED), reflection high-energy electron diffraction (RHEED), atomic absorption spectroscopy (AAS), ultraviolet photoelectron spectroscopy (UPS), Auger electron spectroscopy (AES), X-ray photoelectron spectroscopy (XPS), X-ray fluorescence analysis (XRF), inductively-coupled plasma atomic emission spectrometry (ICP-AES), electron probe microanalysis (EPMA), particle induced X-ray emission analysis (PIXE), low energy ion scattering analysis (RBS or LEIS), middle energy ion scattering analysis (MEIS), high energy ion scattering analysis (ISS or HEIS), gel permeation chromatography (GPC), transmission electron microscopy—energy-dispersive X-ray analysis (TEM-EDX), scanning electron microscopy—energy-dispersive X-ray analysis (SEM-EDX), gas chromatography (GC), and other elementary analysis techniques.

EXAMPLES

Example A1

Formation of Sheet (i)

Methyl methacrylate and polystyrene adopted as components for sheet formation were mixed at a ratio of 90/10 [mass ratio] and azobisisobutyronitrile adopted as thermal polymerization initiator was added in an amount of 0.5 mass % relative to methyl methacrylate, thereby preparing a composition for sheet formation. Here, the expression "added in an amount of 0.5 mass % relative to methyl methacrylate" means that the initiator added accounted for 0.5 mass % relative to the total quantity, which accounted for 100 mass %, of the methyl methacrylate component used for sheet formation. More specifically, the ratio among methyl methacrylate, polystyrene, and azobisisobutyronitrile was 90/10/0.5*[mass ratio](*0.5 was calculated as 0.5×90/100). This notation also applies hereinafter.

Subsequently, the composition for sheet formation was heated at 80° C. for 60 minutes to perform polymerization, thereby forming a sheet with a thickness of 50 µm. The resulting sheet was a monolayer sheet (sheet (i)). Sheet (i) obtained above was free of crosslinked components and it was a sheet produced from components in a non-mutually dissolved state and had a sea-island type phase-separated structure with a structural period of 96 µm.
(Formation of Inorganic Substance Layer)

A sputtering target of sintered silicon dioxide was prepared and set in a sputtering/chemical vapor deposition apparatus (hereinafter abbreviated as sputtering CVD apparatus).

Argon gas was introduced to adjust the degree of vacuum in the sputtering CVD apparatus to 2×10-1 Pa, and a power of 500 W was applied by a high frequency power source to generate argon gas plasma so that an inorganic substance layer containing a silicon compound with a layer thickness of 100 nm would be formed by sputtering of sheet (i).
(Inorganic Substance-Laminated Sheet)

An inorganic substance-laminated sheet was produced as described above. The sheet in the inorganic substance-laminated sheet produced in this example was a monolayer sheet (sheet (i)) that was free of crosslinked components, was produced from components in a non-mutually dissolved state, and had a sea-island type phase-separated structure with a structural period of 96 µm. The inorganic substance layer was one formed mainly of a silicon compound and the inorganic substance-laminated sheet of this example had higher gas barrier properties as compared with Comparative example A1 given later where the sheet used (in a mutually dissolved state) had no phase-separated structure.

Example A2

Formation of Sheet (i)

Methyl methacrylate and polystyrene adopted as components for sheet formation were mixed at a ratio [mass ratio] of 85/15 and azobisisobutyronitrile was added as thermal polymerization initiator in an amount of 0.5 mass % relative to methyl methacrylate, thereby preparing a composition for sheet formation.

Subsequently, the composition for sheet formation was heated at 80° C. for 60 minutes to perform polymerization, thereby forming a sheet with a thickness of 50 µm. The resulting sheet was a monolayer sheet (sheet (i)). Sheet (i) obtained above, which was free of crosslinked components, was produced from components in a non-mutually dissolved state and had a sea-island type phase-separated structure with a structural period of 54 µm.
(Formation of Inorganic Substance Layer)

The same procedure as in Example A1 was carried out to produce an inorganic substance layer of a silicon compound with a layer thickness of 100 nm on sheet (i).
(Inorganic Substance-Laminated Sheet)

An inorganic substance-laminated sheet was produced as described above. The sheet in the inorganic substance-laminated sheet produced in this example was a monolayer sheet (sheet (i)) that was free of crosslinked components, was produced from components in a non-mutually dissolved state, and had a sea-island type phase-separated structure with a structural period of 54 µm. The inorganic substance layer was one formed mainly of a silicon compound and the inorganic substance-laminated sheet of this example had higher gas barrier properties as compared with Comparative example A1 given later where the sheet used (in a mutually dissolved state) had no phase-separated structure.

Example A3

Formation of Sheet (i)

Methyl methacrylate and polystyrene adopted as components for sheet formation were mixed at a ratio of 80/20 [mass ratio] and azobisisobutyronitrile was added as thermal polymerization initiator in an amount of 0.5 mass % relative to methyl methacrylate, thereby preparing a composition for sheet formation.

Subsequently, the composition for sheet formation was heated at 80° C. for 60 minutes to perform polymerization, thereby forming a sheet with a thickness of 50 µm. The resulting sheet was a monolayer sheet (sheet (i)). Sheet (i) obtained above, which was free of crosslinked components, was produced from components in a non-mutually dissolved state and had a sea-island type phase-separated structure with a structural period of 45 µm.
(Formation of Inorganic Substance Layer)

The same procedure as in Example A1 was carried out to produce an inorganic substance layer of a silicon compound with a layer thickness of 100 nm on sheet (i).
(Inorganic Substance-Laminated Sheet)

An inorganic substance-laminated sheet was produced as described above. The sheet in the inorganic substance-laminated sheet produced in this example was a monolayer sheet (sheet (i)) that was free of crosslinked components, was produced from components in a non-mutually dissolved state, and had a sea-island type phase-separated structure with a structural period of 45 µm. The inorganic substance layer was one formed mainly of a silicon compound and the inorganic substance-laminated sheet of this example had higher gas barrier properties as compared with Examples A1 and A2 because the phase-separated structure in the sheet had a structural period in a preferable range.

Example A4

Formation of Sheet (i)

Methyl methacrylate and polystyrene adopted as components for sheet formation were mixed at a ratio of 70/30 [mass ratio] and azobisisobutyronitrile was added as thermal polymerization initiator in an amount of 0.5 mass % relative to methyl methacrylate, thereby preparing a composition for sheet formation.

Subsequently, the composition for sheet formation was heated at 80° C. for 60 minutes to perform polymerization, thereby forming a sheet with a thickness of 50 µm. The resulting sheet was a monolayer sheet (sheet (i)). Sheet (i) obtained above, which was free of crosslinked components, was produced from components in a non-mutually dissolved state and had a sea-island type phase-separated structure with a structural period of 1.3 µm.
(Formation of Inorganic Substance Layer)

The same procedure as in Example A1 was carried out to produce an inorganic substance layer of a silicon compound with a layer thickness of 100 nm on sheet (i).
(Inorganic Substance-Laminated Sheet)

An inorganic substance-laminated sheet was produced as described above. The sheet in the inorganic substance-laminated sheet produced in this example was a monolayer sheet (sheet (i)) that was free of crosslinked components, was produced from components in a non-mutually dissolved state, and had a sea-island type phase-separated structure with a structural period of 1.3 μm. The inorganic substance layer was one formed mainly of a silicon compound and the inorganic substance-laminated sheet of this example had higher gas barrier properties as compared with Examples A1 and A2 because the phase-separated structure in the sheet had a structural period in a more preferable range.

Example A5

Formation of Substrate Layer of Sheet (ii)

Polyethylene terephthalate film (trade name: Lumirror (registered trademark) U48, manufactured by Toray Industries, Inc.) with a thickness of 50 μm was used as base.

Subsequently, methyl acrylate and polymethyl methacrylate (PMMA) adopted as components for substrate layer formation were mixed at a ratio of 10/90 [mass ratio] and 2-methyl 1-[4-(methylthio)phenyl]-2-morpholinopropane-1-one (IRGACURE 907, manufactured by BASF) and 2-benzyl-2-dimethylamino-1-(4-morpholinophenyl) butanone-1 (IRGACURE 369 manufactured by BASF) were added as photopolymerization initiators each in an amount of 2.5 mass % (a total of 5 mass %) relative to methyl acrylate. Then, a solvent of ethyl acetate and cyclohexanone mixed at a ratio of 70/30 [mass ratio] was added to dilute the mixture to a solid content of 10 mass %, thereby preparing a coating liquid for substrate layer formation.

Following this, the coating liquid for substrate layer formation was applied to a polyethylene terephthalate film with a Micro Gravure Coater (gravure line number 80R, gravure rotation ratio 100%), dried by heating at 80° C. for 30 seconds, and polymerized by application of ultraviolet ray at 0.8 J/cm2 to form a substrate layer with a thickness of 1 μm. The resulting sheet was a laminate sheet (sheet (ii)). The substrate layer of sheet (ii) was free of crosslinked components, but a phase-separated structure was formed by irradiating the components of the substrate layer with ultraviolet ray, i.e. a kind of electromagnetic wave, while they were in a mutually dissolved state, and it was found to contain a sea-island type phase-separated structure with a structural period of 0.7 μm.
(Formation of Inorganic Substance Layer)

The same procedure as in Example A1 was carried out to produce an inorganic substance layer of a silicon compound with a layer thickness of 100 nm on the substrate layer of sheet (ii).
(Inorganic Substance-Laminated Sheet)

An inorganic substance-laminated sheet was produced as described above. The sheet in the inorganic substance-laminated sheet of this example was a laminate sheet (sheet (ii)) composed of a base layer and a substrate layer laminated on one surface thereof. The substrate layer was free of crosslinked components, but a phase-separated structure was formed by irradiating the components of the substrate layer with ultraviolet ray, i.e. a kind of electromagnetic wave, while they were in a mutually dissolved state, and it was found to contain a sea-island type phase-separated structure with a smaller structural period of 0.7 μm as compared with Examples A1 to A4. The inorganic substance layer was one formed mainly of a silicon compound and the inorganic substance-laminated sheet of this example had higher gas barrier properties as compared with Examples A1 to A4 because the phase-separated structure in the substrate layer had a structural period in a still more preferable range than in Examples A1 to A4.

Example A6

Formation of Substrate Layer of Sheet (ii)

The same procedure as in Example A5 was carried out to produce a laminate sheet (sheet (ii)) that had a substrate layer in which no crosslinked components were included but in which a phase-separated structure had been formed by irradiating the adopted components with ultraviolet ray, i.e. a kind of electromagnetic wave, while they were in a mutually dissolved state, and it was found, to contain a sea-island type phase-separated structure with a structural period of 0.7 μm.
(Formation of Inorganic Substance Layer)

A sputtering target of a sintered mixture of zinc oxide, silicon dioxide, and aluminum oxide (composition ratio by mass among zinc oxide, silicon dioxide, and aluminum oxide was 77.0/20.0/3.0) was set in a sputtering CVD apparatus.

A mixture of argon gas and oxygen gas with an oxygen gas partial pressure of 10% was then introduced to adjust the degree of vacuum in the sputtering CVD apparatus to 2×10-1 Pa, and a power of 500 W was applied by a direct current power source to generate argon-oxygen gas plasma so that an inorganic substance layer, specifically [inorganic A] layer, with a layer thickness of 150 nm would be formed by sputtering of the substrate layer of sheet (ii). With respect to the composition of this inorganic substance layer, ZnO was found to account for 71.2 mass %, $Al_2O_3$ for 3.7 mass %, SiO2 for 25.1 mass %, and ZnO and $Al_2O_3$ together for 74.9 mass %.
(Inorganic Substance-Laminated Sheet)

An inorganic substance-laminated sheet was produced as described above. The inorganic substance layer was an [inorganic A] layer and the inorganic substance-laminated sheet of this example, which had an inorganic substance layer according to a preferable embodiment, had still higher gas barrier properties as compared with Example A5 and Comparative example A2 given later where the substrate layer used (in a mutually dissolved state) had no phase-separated structure.

Example A7

Formation of Substrate Layer of Sheet (ii)

Polyethylene terephthalate film (trade name: Lumirror (registered trademark) U48, manufactured by Toray Industries, Inc.) with a thickness of 50 μm was adopted.

Subsequently, methyl acrylate and polymethyl methacrylate (PMMA) adopted as components for substrate layer formation were mixed at a ratio of 20/80 [mass ratio] and 2-methyl 1-[4-(methylthio)phenyl]-2-morpholinopropane-1-one (IRGACURE 907, manufactured by BASF) and 2-benzyl-2-dimethylamino-1-(4-morpholinophenyl) butanone-1 (IRGACURE 369 manufactured by BASF) were added as photopolymerization initiators each in an amount of 2.5 mass % (a total of 5 mass %) relative to methyl acrylate. Then, a solvent of ethyl acetate and cyclohexanone mixed at a ratio of 70/30 [mass ratio] was added to dilute the mixture to a solid content of 10 mass %, thereby preparing a coating liquid for substrate layer formation.

Following this, the coating liquid for substrate layer formation was applied to a polyethylene terephthalate film with a Micro Gravure Coater (gravure line number 80R, gravure rotation ratio 100%), dried by heating at 80° C. for 30 seconds, and polymerized by application of ultraviolet ray at 0.8 J/cm2 to form a substrate layer with a thickness of 1 μm. This sheet was a laminate sheet (sheet (ii)) and the substrate layer was free of crosslinked components, but a phase-separated structure was formed by irradiating the components of the substrate layer with ultraviolet ray, i.e. a kind of electromagnetic wave, while they were in a mutually dissolved state, and the substrate layer was found to contain a co-continuous type phase-separated structure with a structural period of 0.15 μm.

(Formation of Inorganic Substance Layer)

The same procedure as in Example A6 was carried out to produce an inorganic substance layer, specifically an [inorganic A] layer, with a layer thickness of 150 nm on the substrate layer of sheet (ii).

(Inorganic Substance-Laminated Sheet)

An inorganic substance-laminated sheet was produced as described above. The sheet in the inorganic substance-laminated sheet of this example was a laminate sheet (sheet (ii)) composed of a base layer and a substrate layer laminated on one surface thereof. The substrate layer was free of crosslinked components, but a phase-separated structure was formed by irradiating the components of the substrate layer, which were different from those in Example A6, with ultraviolet ray, i.e. a kind of electromagnetic wave, while they were in a mutually dissolved state, and it was found to contain a co-continuous type phase-separated structure that not only had a smaller structural period of 0.15 μm, but also had a different structural shape, as compared with Example A6. Furthermore, the inorganic substance layer was an [inorganic A] layer, and the gas barrier properties of the inorganic substance-laminated sheet of this example were able to be controlled as compared with Example A6 as result of a co-continuous type phase-separated structure of a structural shape different from that in Example A6 being formed in the substrate layer.

Example A8

Formation of Substrate Layer of Sheet (ii)

Polyethylene terephthalate film (trade name: Lumirror (registered trademark) U48, manufactured by Toray Industries, Inc.) with a thickness of 50 μm was adopted.

Subsequently, dipentaerythritol hexaacrylate and polymethyl methacrylate (PMMA) adopted as components for substrate layer formation were mixed at a ratio of 20/80 [mass ratio] and 2-methyl 1-[4-(methylthio)phenyl]-2-morpholinopropane-1-one (IRGACURE 907, manufactured by BASF) and 2-benzyl-2-dimethylamino-1-(4-morpholinophenyl) butanone-1 (IRGACURE 369 manufactured by BASF) were added as photopolymerization initiators each in an amount of 2.5 mass % (a total of 5 mass %) relative to dipentaerythritol hexaacrylate. Then, a solvent of ethyl acetate and cyclohexanone mixed at a ratio of 70/30 [mass ratio] was added to dilute the mixture to a solid content of 10 mass %, thereby preparing a coating liquid for substrate layer formation.

Following this, the coating liquid for substrate layer formation was applied to a polyethylene terephthalate film with a Micro Gravure Coater (gravure line number 80R, gravure rotation ratio 100%), dried by heating at 80° C. for 30 seconds, and polymerized by application of ultraviolet ray at 0.8 J/cm2 to form a substrate layer with a thickness of 1 μm. This sheet was a laminate sheet (sheet (ii)). The substrate layer contained a crosslinked component, and a phase-separated structure was formed by irradiating the adopted components with ultraviolet ray, i.e. a kind of electromagnetic wave, while they were in a mutually dissolved state. Thus the substrate layer was found to contain a co-continuous type phase-separated structure with a structural period of 0.093 μm.

(Formation of Inorganic Substance Layer)

The same procedure as in Example A6 was carried out to produce an inorganic substance layer, specifically an [inorganic A] layer, with a layer thickness of 150 nm on the substrate layer of sheet (ii).

(Inorganic Substance-Laminated Sheet)

An inorganic substance-laminated sheet was produced as described above. The sheet in the inorganic substance-laminated sheet of this example was a laminate sheet (sheet (ii)) composed of a base layer and a substrate layer laminated on one surface thereof. The substrate layer, unlike Example A7, contained a crosslinked component, and a phase-separated structure was formed by irradiating the components of the substrate layer with ultraviolet ray, i.e. a kind of electromagnetic wave, while they were in a mutually dissolved state, and the substrate layer was found to contain a co-continuous type phase-separated structure with a smaller structural period of 0.093 μm as compared with Example A7. The inorganic substance layer was an [inorganic A] layer and the inorganic substance-laminated sheet of this example had higher gas barrier properties as compared with Example A7 because the phase-separated structure in the substrate layer had a structural period in a still more preferable range than in Example A7.

Example A9

Formation of Substrate Layer of Sheet (ii)

Polyethylene terephthalate film (trade name: Lumirror (registered trademark) U48, manufactured by Toray Industries, Inc.) with a thickness of 50 μm was adopted.

Subsequently, dipentaerythritol hexaacrylate and polymethyl methacrylate (PMMA) adopted as components for substrate layer formation were mixed at a ratio of 80/20 [mass ratio] and 2-methyl 1-[4-(methylthio)phenyl]-2-morpholinopropane-1-one (IRGACURE 907, manufactured by BASF) and 2-benzyl-2-dimethylamino-1-(4-morpholinophenyl) butanone-1 (IRGACURE 369 manufactured by BASF) were added as photopolymerization initiators each in an amount of 2.5 mass % (a total of 5 mass %) relative to dipentaerythritol hexaacrylate. Then, a solvent of ethyl acetate and cyclohexanone mixed at a ratio of 70/30 [mass ratio] was added to dilute the mixture to a solid content of 10 mass %, thereby preparing a coating liquid for substrate layer formation.

Following this, the coating liquid for substrate layer formation was applied to a polyethylene terephthalate film with a Micro Gravure Coater (gravure line number 80R, gravure rotation ratio 100%), dried by heating at 80° C. for 30 seconds, and polymerized by application of ultraviolet ray at 0.8 J/cm2 to form a substrate layer with a thickness of 1 μm. This sheet was a laminate sheet (sheet (ii)). The substrate layer contained a crosslinked component, and a phase-separated structure was formed by irradiating the components with ultraviolet ray, i.e. a kind of electromagnetic wave, while they were in a mutually dissolved state. Thus the substrate layer was found to contain a co-continuous type phase-separated structure with a structural period of 0.082 μm.

(Formation of Inorganic Substance Layer)

The same procedure as in Example A6 was carried out to produce an inorganic substance layer, specifically an [inorganic A] layer, with a layer thickness of 150 nm on the substrate layer of sheet (ii).

(Inorganic Substance-Laminated Sheet)

An inorganic substance-laminated sheet was produced as described above. The sheet in the inorganic substance-laminated sheet of this example was a laminate sheet (sheet (ii)) composed of a base layer and a substrate layer laminated on one surface thereof. The substrate layer contained a crosslinked component, and a phase-separated structure was formed by irradiating the components of the substrate layer mixed at a component ratio different from that in Example A8 with ultraviolet ray, i.e. a kind of electromagnetic wave, while they were in a mutually dissolved state, and the substrate layer was found to contain a co-continuous type phase-separated structure with a smaller structural period of 0.082 μm as compared with Example A7. Furthermore, the inorganic substance layer was an [inorganic A] layer, and the gas barrier properties of the inorganic substance-laminated sheet of this example were able to be controlled as result of altering the component ratio in the substrate layer from Example A8 though the same components were contained.

Example A10

Formation of Substrate Layer of Sheet (ii)

Polyethylene terephthalate film (trade name: Lumirror (registered trademark) U48, manufactured by Toray Industries, Inc.) with a thickness of 50 μm was adopted.

Subsequently, pentaerythritol tetraacrylate and polymethyl methacrylate (PMMA) adopted as components for substrate layer formation were mixed at a ratio of 80/20 [mass ratio] and 2-methyl 1-[4-(methylthio)phenyl]-2-morpholinopropane-1-one (IRGACURE 907, manufactured by BASF) and 2-benzyl-2-dimethylamino-1-(4-morpholinophenyl) butanone-1 (IRGACURE 369 manufactured by BASF) were added as photopolymerization initiators each in an amount of 2.5 mass % (a total of 5 mass %) relative to pentaerythritol tetraacrylate. Then, a solvent of ethyl acetate and cyclohexanone mixed at a ratio of 70/30 [mass ratio] was added to dilute the mixture to a solid content of 10 mass %, thereby preparing a coating liquid for substrate layer formation.

Following this, the coating liquid for substrate layer formation was applied to a polyethylene terephthalate film with a Micro Gravure Coater (gravure line number 80R, gravure rotation ratio 100%), dried by heating at 80° C. for 30 seconds, and polymerized by application of ultraviolet ray at 0.8 J/cm2 to form a substrate layer with a thickness of 1 μm. This sheet was a laminate sheet (sheet (ii)). The substrate layer contained a crosslinked component, and a phase-separated structure was formed by irradiating the components with ultraviolet ray, i.e. a kind of electromagnetic wave, while they were in a mutually dissolved state. Thus the substrate layer was found to contain a co-continuous type phase-separated structure with a structural period of 0.051 μm.

(Formation of Inorganic Substance Layer)

The same procedure as in Example A6 was carried out to produce an inorganic substance layer, specifically an [inorganic A] layer, with a layer thickness of 150 nm on the substrate layer of sheet (ii).

(Inorganic Substance-Laminated Sheet)

An inorganic substance-laminated sheet was produced as described above. The sheet in the inorganic substance-laminated sheet of this example was a laminate sheet (sheet (ii)) composed of a base layer and a substrate layer laminated on one surface thereof. The substrate layer contained a crosslinked component, and a phase-separated structure was formed by irradiating the components of the substrate layer mixed at a component ratio different from that in Example A9 with ultraviolet ray, i.e. a kind of electromagnetic wave, while they were in a mutually dissolved state, and the substrate layer was found to contain a co-continuous type phase-separated structure with a smaller structural period of 0.051 μm as compared with Example A9. Furthermore, the inorganic substance layer was an [inorganic A] layer, and the gas barrier properties of the inorganic substance-laminated sheet of this example were able to be controlled as result of altering the components in the substrate layer from Example A9, though the component ratio remained the same, so as to change the structural period of the phase-separated structure.

Example A11

Formation of Substrate Layer of Sheet (ii)

Except for polymerizing the substrate layer by irradiation with ultraviolet ray at 1.9 J/cm2, the same procedure as in Example A10 was carried out to produce a laminate sheet that had a substrate layer in which crosslinked components were included and in which a phase-separated structure had been formed by irradiating the components with an altered cumulative dose of ultraviolet ray, i.e. a kind of electromagnetic wave, while they were in a mutually dissolved state, and it was found to contain a co-continuous type phase-separated structure with a structural period of 0.024 μm.

(Formation of Inorganic Substance Layer)

The same procedure as in Example A6 was carried out to produce an inorganic substance layer, specifically an [inorganic A] layer, with a layer thickness of 150 nm on the substrate layer of sheet (ii).

(Inorganic Substance-Laminated Sheet)

An inorganic substance-laminated sheet was produced as described above. The sheet in the inorganic substance-laminated sheet of this example was a laminate sheet (sheet (ii)) composed of a base layer and a substrate layer laminated on one surface thereof. The substrate layer contained a crosslinked component, and a phase-separated structure had been formed by irradiating the components of the substrate layer with a larger cumulative dose of ultraviolet ray, i.e. a kind of electromagnetic wave, than in Example A10 while they were in a mutually dissolved state. The substrate layer was found to contain a co-continuous type phase-separated structure with a smaller structural period of 0.024 μm as compared with Example A10. The inorganic substance layer was an [inorganic A] layer and the inorganic substance-laminated sheet of this example had higher gas barrier properties as compared with Example A10 because the phase-separated structure in the substrate layer had a structural period in a still more preferable range than in Example A10.

Example A12

Formation of Substrate Layer of Sheet (ii)

Polyethylene terephthalate film (trade name: Lumirror (registered trademark) U48, manufactured by Toray Industries, Inc.) with a thickness of 50 μm was adopted.

Subsequently, pentaerythritol tetraacrylate and polymethyl methacrylate (PMMA) adopted as components for substrate layer formation were mixed at a ratio of 90/10 [mass ratio] and 2-methyl 1-[4-(methylthio)phenyl]-2-morpholinopropane-1-one (IRGACURE 907, manufactured by BASF) and 2-benzyl-2-dimethylamino-1-(4-morpholinophenyl) butanone-1 (IRGACURE 369 manufactured by BASF) were added as photopolymerization initiators each in an amount of 2.5 mass % (a total of 5 mass %) relative to pentaerythritol tetraacrylate. Then, a solvent of ethyl acetate and cyclohexanone mixed at a ratio of 70/30 [mass ratio] was added to dilute the mixture to a solid content of 10 mass %, thereby preparing a coating liquid for substrate layer formation.

Following this, the coating liquid for substrate layer formation was applied to a polyethylene terephthalate film with a Micro Gravure Coater (gravure line number 80R, gravure rotation ratio 100%), dried by heating at 80° C. for 30 seconds, and polymerized by application of ultraviolet ray at 0.8 J/cm2 to form a substrate layer with a thickness of 1 μm. This sheet was a laminate sheet (sheet (ii)). The substrate layer contained a crosslinked component, and a phase-separated structure was formed by irradiating the components with ultraviolet ray, i.e. a kind of electromagnetic wave, while they were in a mutually dissolved state. Thus the substrate layer was found to contain a co-continuous type phase-separated structure with a structural period of 0.012 μm.

(Formation of Inorganic Substance Layer)

The same procedure as in Example A6 was carried out to produce an inorganic substance layer, specifically an [inorganic A] layer, with a layer thickness of 150 nm on the substrate layer of sheet (ii).

(Inorganic Substance-Laminated Sheet)

An inorganic substance-laminated sheet was produced as described above. The sheet in the inorganic substance-laminated sheet of this example was a laminate sheet (sheet (ii)) composed of a base layer and a substrate layer laminated on one surface thereof. The substrate layer contained a crosslinked component, and a phase-separated structure was formed by irradiating the components of the substrate layer mixed at a component ratio different from that in Example A10 with ultraviolet ray, i.e. a kind of electromagnetic wave, while they were in a mutually dissolved state, and the substrate layer was found to contain a co-continuous type phase-separated structure with a smaller structural period of 0.012 μm as compared with Examples A10 and A11. The inorganic substance layer was an [inorganic A] layer and the inorganic substance-laminated sheet of this example had higher gas barrier properties as compared with Example A10 because the component ratio in the substrate layer had been altered so that the phase-separated structure in the substrate layer would be able to have a structural period adjusted in a preferable range without altering the conditions for ultraviolet ray irradiation with the components while in a mutually dissolved state as in Example A11.

Example A13

Formation of Substrate Layer of Sheet (ii)

Except for polymerizing the substrate layer by irradiation with ultraviolet ray at 1.9 J/cm2, the same procedure as in Example A12 was carried out to produce a laminate sheet (sheet (ii)) that had a substrate layer in which crosslinked components were included and in which a phase-separated structure had been formed by irradiating the components with an altered cumulative dose of ultraviolet ray, i.e. a kind of electromagnetic wave, while they were in a mutually dissolved state, and it was found to contain a co-continuous type phase-separated structure with a structural period of 0.006 μm.

(Formation of Inorganic Substance Layer)

The same procedure as in Example A6 was carried out to produce an inorganic substance layer, specifically an [inorganic A] layer, with a layer thickness of 150 nm on the substrate layer of sheet (ii).

(Inorganic Substance-Laminated Sheet)

An inorganic substance-laminated sheet was produced as described above. The sheet in the inorganic substance-laminated sheet of this example was a laminate sheet (sheet (ii)) composed of a base layer and a substrate layer laminated on one surface thereof. The substrate layer contained a crosslinked component, and a phase-separated structure had been formed by irradiating the components of the substrate layer with a larger cumulative dose of ultraviolet ray, i.e. a kind of electromagnetic wave, than in Example A12 while they were in a mutually dissolved state. The substrate layer was found to contain a co-continuous type phase-separated structure with a smaller structural period of 0.006 μm as compared with Example A12. Furthermore, the inorganic substance layer was an [inorganic A] layer, and the gas barrier properties of the inorganic substance-laminated sheet of this example were able to be controlled because the phase-separated structure in the substrate layer had a smaller structural period than in Example A12.

Example A14

Formation of Substrate Layer of Sheet (ii)

Polyethylene terephthalate film (trade name: Lumirror (registered trademark) U48, manufactured by Toray Industries, Inc.) with a thickness of 50 μm was adopted.

Subsequently, trimethylolpropane triacrylate and polymethyl methacrylate (PMMA) adopted as components for substrate layer formation were mixed at a ratio of 80/20 [mass ratio] and 2-methyl 1-[4-(methylthio)phenyl]-2-morpholinopropane-1-one (IRGACURE 907, manufactured by BASF) and 2-benzyl-2-dimethylamino-1-(4-morpholinophenyl) butanone-1 (IRGACURE 369 manufactured by BASF) were added as photopolymerization initiators each in an amount of 2.5 mass % (a total of 5 mass %) relative to trimethylolpropane triacrylate. Then, a solvent of ethyl acetate and cyclohexanone mixed at a ratio of 70/30 [mass ratio] was added to dilute the mixture to a solid content of 10 mass %, thereby preparing a coating liquid for substrate layer formation.

Following this, the coating liquid for substrate layer formation was applied to a polyethylene terephthalate film with a Micro Gravure Coater (gravure line number 80R, gravure rotation ratio 100%), dried by heating at 80° C. for 30 seconds, and polymerized by application of ultraviolet ray at 0.8 J/cm2 to form a substrate layer with a thickness of 1 μm. This sheet was a laminate sheet (sheet (ii)). The substrate layer contained a crosslinked component, and a phase-separated structure was formed by irradiating the components with ultraviolet ray, i.e. a kind of electromagnetic wave, while they were in a mutually dissolved state. Thus the substrate layer was found to contain a co-continuous type phase-separated structure with a structural period of 0.003 μm.

(Formation of Inorganic Substance Layer)

The same procedure as in Example A6 was carried out to produce an inorganic substance layer, specifically an [inorganic A] layer, with a layer thickness of 150 nm on the substrate layer of sheet (ii).

(Inorganic Substance-Laminated Sheet)

An inorganic substance-laminated sheet was produced as described above. The sheet in the inorganic substance-laminated sheet of this example was a laminate sheet (sheet (ii)) composed of a base layer and a substrate layer laminated on one surface thereof. The substrate layer contained a crosslinked component, and a phase-separated structure was formed by irradiating the components of the substrate layer with ultraviolet ray, i.e. a kind of electromagnetic wave, while they were in a mutually dissolved state, and the substrate layer was found to contain a co-continuous type phase-separated structure with a still smaller structural period of 0.003 µm as compared with Example A13. Furthermore, the inorganic substance layer was an [inorganic A] layer, and the gas barrier properties of the inorganic substance-laminated sheet of this example were able to be controlled because the phase-separated structure in the substrate layer had a smaller structural period than in Example A12.

Example A15

Formation of Substrate Layer of Sheet (ii)

The same procedure as in Example A10 was carried out to produce a laminate sheet (sheet (ii)) that had a substrate layer in which crosslinked components were included and in which a phase-separated structure had been formed by irradiating the components with ultraviolet ray, i.e. a kind of electromagnetic wave, while they were in a mutually dissolved state. It was found to contain a co-continuous type phase-separated structure with a structural period of 0.051 µm.

(Formation of Inorganic Substance Layer)

Except for setting the thickness to 120 nm, the same procedure as in Example A6 was carried out to produce an inorganic substance layer, specifically an [inorganic A] layer, on the substrate layer of sheet (ii).

(Inorganic Substance-Laminated Sheet)

An inorganic substance-laminated sheet was produced as described above. Furthermore, the inorganic substance layer was an [inorganic A] layer, and the gas barrier properties of the inorganic substance-laminated sheet of this example were able to be controlled more effectively than in Example A10 by altering the thickness of the inorganic substance layer.

Example A16

Formation of Substrate Layer of Sheet (ii)

The same procedure as in Example A10 was carried out to produce a laminate sheet (sheet (ii)) that had a substrate layer in which crosslinked components were included and in which a phase-separated structure had been formed by irradiating the components with ultraviolet ray, i.e. a kind of electromagnetic wave, while they were in a mutually dissolved state. It was found to contain a co-continuous type phase-separated structure with a structural period of 0.051 µm.

(Formation of Inorganic Substance Layer)

Except for setting the thickness to 100 nm, the same procedure as in Example A6 was carried out to produce an inorganic substance layer, specifically an [inorganic A] layer, on the substrate layer of sheet (ii).

(Inorganic Substance-Laminated Sheet)

An inorganic substance-laminated sheet was produced as described above. Furthermore, the inorganic substance layer was an [inorganic A] layer, and the gas barrier properties of the inorganic substance-laminated sheet of this example were able to be controlled more effectively than in Examples A10 and A15 by altering the thickness of the inorganic substance layer.

Example A17

Formation of Substrate Layer of Sheet (ii)

The same procedure as in Example A10 was carried out to produce a laminate sheet (sheet (ii)) that had a substrate layer in which crosslinked components were included and in which a phase-separated structure had been formed by irradiating the components with ultraviolet ray, i.e. a kind of electromagnetic wave, while they were in a mutually dissolved state. It was found to contain a co-continuous type phase-separated structure with a structural period of 0.051 µm.

(Formation of Inorganic Substance Layer)

Except for setting the thickness to 50 nm, the same procedure as in Example A6 was carried out to produce an inorganic substance layer, specifically an [inorganic A] layer, on the substrate layer of sheet (ii).

(Inorganic Substance-Laminated Sheet)

An inorganic substance-laminated sheet was produced as described above. Furthermore, the inorganic substance layer was an [inorganic A] layer, and the gas barrier properties of the inorganic substance-laminated sheet of this example were able to be controlled more effectively than in Examples A10, A15, and A18 by altering the thickness of the inorganic substance layer.

Example A18

Formation of Substrate Layer of Sheet (ii)

The same procedure as in Example A10 was carried out to produce a laminate sheet (sheet (ii)) that had a substrate layer in which crosslinked components were included and in which a phase-separated structure had been formed by irradiating the components with ultraviolet ray, i.e. a kind of electromagnetic wave, while they were in a mutually dissolved state. It was found to contain a co-continuous type phase-separated structure with a structural period of 0.051 µm.

(Formation of Inorganic Substance Layer)

Except for setting the thickness to 15 nm, the same procedure as in Example A6 was carried out to produce an inorganic substance layer, specifically an [inorganic A] layer, on the substrate layer of sheet (ii).

(Inorganic Substance-Laminated Sheet)

An inorganic substance-laminated sheet was produced as described above. Furthermore, the inorganic substance layer was an [inorganic A] layer, and the inorganic substance-laminated sheet of this example had poorer gas barrier properties than in Examples A10, A15, A16, and A17 as a result of decreasing the thickness of the inorganic substance layer.

Example A19

Formation of Substrate Layer of Sheet (ii)

The same procedure as in Example A10 was carried out to produce a laminate sheet that had a substrate layer in which crosslinked components were included and in which a phase-separated structure had been formed by irradiating the components with ultraviolet ray, i.e. a kind of electromagnetic wave, while they were in a mutually dissolved state. It was found to contain a co-continuous type phase-separated structure with a structural period of 0.051 μm.
(Formation of Inorganic Substance Layer) A sputtering target of a sintered mixture of zinc sulfide and silicon dioxide (composition ratio by mole between zinc sulfide and silicon dioxide was 80/20) was set in a sputtering CVD apparatus.

Argon gas was introduced to adjust the degree of vacuum in the sputtering CVD apparatus to 2×10-1 Pa, and a power of 500 W was applied by a high frequency power source to generate argon gas plasma so that an inorganic substance layer, specifically an [inorganic B] layer, with a layer thickness of 150 nm would be formed by sputtering of the substrate layer of sheet (ii). With respect to the composition of this inorganic substance layer, ZnS and $SiO_2$ accounted for 86.7 mass % and 13.3 mass %, respectively.
(Inorganic Substance-Laminated Sheet)

An inorganic substance-laminated sheet was produced as described above. The inorganic substance layer was an [inorganic B] layer, and the inorganic substance-laminated sheet of this example had a phase-separated structure in the substrate layer and accordingly showed higher gas barrier properties as compared with Comparative example A3 given later where the substrate layer used (in a mutually dissolved state) contained no phase-separated structure. Improvement in gas barrier properties was achieved in spite of an inorganic substance layer different from that in Example A10.

Example A20

Formation of Substrate Layer of Sheet (ii)

The same procedure as in Example A10 was carried out to produce a laminate sheet (sheet (ii)) that had a substrate layer in which crosslinked components were included and in which a phase-separated structure had been formed by irradiating the components with ultraviolet ray, i.e. a kind of electromagnetic wave, while they were in a mutually dissolved state. It was found to contain a co-continuous type phase-separated structure with a structural period of 0.051 μm.
(Formation of Inorganic Substance Layer)

A deposition material of aluminum was set in a vacuum deposition apparatus.

Subsequently, using the aforementioned vacuum deposition apparatus, aluminum was evaporated by resistance heating while introducing oxygen gas to perform vacuum deposition, thereby forming an inorganic substance layer, specifically a layer of an aluminum compound, with a layer thickness of 20 nm on the substrate layer of sheet (ii).
(Inorganic Substance-Laminated Sheet)

An inorganic substance-laminated sheet was produced as described above. The inorganic substance layer was one formed mainly of an aluminum compound and the inorganic substance-laminated sheet of this example contained a phase-separated structure in the substrate layer and accordingly had higher gas barrier properties as compared with Comparative example A4 given later where the substrate layer used (in a mutually dissolved state) had no phase-separated structure.

Example A21

Formation of Substrate Layer of Sheet (ii)

Polyethylene naphthalate film with a thickness of 50 μm was adopted.

Then the same procedure as in Example A10 was carried out to produce a laminate sheet (sheet (ii)) that had a substrate layer in which crosslinked components were included and in which a phase-separated structure had been formed by irradiating the components with ultraviolet ray, i.e. a kind of electromagnetic wave, while they were in a mutually dissolved state. It was found to contain a co-continuous type phase-separated structure with a structural period of 0.051 μm.
(Formation of Inorganic Substance Layer)

The same procedure as in Example A6 was carried out to produce an inorganic substance layer, specifically an [inorganic A] layer, with a layer thickness of 150 nm on the substrate layer of sheet (ii).
(Inorganic Substance-Laminated Sheet)

An inorganic substance-laminated sheet was produced as described above. The inorganic substance-laminated sheet of this example was composed of a polyethylene naphthalate film on which a substrate layer and an inorganic substance layer had been formed by the same procedure as in Example A10. High gas barrier properties were also achieved when a polyethylene naphthalate film was used instead of the polyethylene terephthalate film.

Example A22

Formation of Substrate Layer of Sheet (ii)

Cycloolefin copolymer resin film (trade name: F-film F1, manufactured by Gunze Limited) with a thickness of 100 μm was adopted.

Then the same procedure as in Example A10 was carried out to produce a laminate sheet (sheet (ii)) that had a substrate layer in which crosslinked components were included and in which a phase-separated structure had been formed by irradiating the components with ultraviolet ray, i.e. a kind of electromagnetic wave, while they were in a mutually dissolved state. It was found to contain a co-continuous type phase-separated structure with a structural period of 0.051 μm.
(Formation of Inorganic Substance Layer)

The same procedure as in Example A6 was carried out to produce an inorganic substance layer, specifically an [inorganic A] layer, with a layer thickness of 150 nm on the substrate layer of sheet (ii).
(Inorganic Substance-Laminated Sheet)

An inorganic substance-laminated sheet was produced as described above. The inorganic substance-laminated sheet of this example was composed of a cycloolefin copolymer resin film on which a substrate layer and an inorganic substance layer had been formed by the same procedure as in Example A10. High gas barrier properties were also achieved when a cycloolefin copolymer resin film was used instead of the polyethylene terephthalate film.

Example A23

Formation of Substrate Layer of Sheet (ii)

Cycloolefin copolymer resin film (trade name: Zeonor Film (registered trademark) ZF-16, manufactured by Zeon Corporation) with a thickness of 100 μm was adopted.

Then the same procedure as in Example A10 was carried out to produce a laminate sheet (sheet (ii)) that had a substrate layer in which crosslinked components were included and in which a phase-separated structure had been formed by irradiating the components with ultraviolet ray, i.e. a kind of electromagnetic wave, while they were in a mutually dissolved state. It was found to contain a co-continuous type phase-separated structure with a structural period of 0.051 μm.
(Formation of Inorganic Substance Layer)

The same procedure as in Example A6 was carried out to produce an inorganic substance layer, specifically an [inorganic A] layer, with a layer thickness of 150 nm on the substrate layer of sheet (ii).
(Inorganic Substance-Laminated Sheet)

An inorganic substance-laminated sheet was produced as described above. The inorganic substance-laminated sheet of this example was composed of a cycloolefin resin film on which a substrate layer and an inorganic substance layer had been formed by the same procedure as in Example A10. High gas barrier properties were also achieved when a cycloolefin resin film was used instead of the polyethylene terephthalate film.

Comparative Example A1

Formation of Substrate Layer of Sheet

Polyethylene terephthalate film (trade name: Lumirror (registered trademark) U48, manufactured by Toray Industries, Inc.) with a thickness of 50 μm was adopted.

Subsequently, pentaerythritol tetraacrylate alone was adopted as component for substrate layer formation and 2-methyl 1-[4-(methylthio)phenyl]-2-morpholinopropane-1-one (IRGACURE 907, manufactured by BASF) and 2-benzyl-2-dimethylamino-1-(4-morpholinophenyl) butanone-1 (IRGACURE 369 manufactured by BASF) were added as photopolymerization initiators each in an amount of 2.5 mass % (a total of 5 mass %) relative to pentaerythritol tetraacrylate. Then, a solvent of ethyl acetate and cyclohexanone mixed at a ratio of 70/30 [mass ratio] was added to dilute the mixture to a solid content of 10 mass %, thereby preparing a coating liquid for substrate layer formation.

Following this, the coating liquid for substrate layer formation was applied to a polyethylene terephthalate film with a Micro Gravure Coater (gravure line number 80R, gravure rotation ratio 100%), dried by heating at 80° C. for 30 seconds, and polymerized by application of ultraviolet ray at 0.8 J/cm2 to form a substrate layer with a thickness of 1 μm. This sheet was a laminate sheet composed of a base layer and a substrate layer laminated on one surface thereof, but it did not contain a phase-separated structure.
(Formation of Inorganic Substance Layer)

The same procedure as in Example A1 was carried out to produce an inorganic substance layer of a silicon compound with a layer thickness of 100 nm on the substrate layer of the sheet.
(Inorganic Substance-Laminated Sheet)

An inorganic substance-laminated sheet was produced as described above. The inorganic substance-laminated sheet of this comparative example was composed of a laminate sheet free of phase-separated structures and an inorganic substance layer of a silicon compound laminated thereon and had poorer gas barrier properties as compared with Examples A1 to A5 where an inorganic substance layer was formed in a similar way on a substrate layer having a phase-separated structure.

Comparative Example A2

Formation of Substrate Layer of Sheet

The same procedure as in Comparative example A1 was carried out to produce a laminate sheet having a substrate layer free of phase-separated structures.
(Formation of Inorganic Substance Layer)

The same procedure as in Example A6 was carried out to produce an inorganic substance layer, specifically an [inorganic A] layer, with a layer thickness of 150 nm on the substrate layer of the aforementioned sheet.
(Inorganic Substance-Laminated Sheet)

An inorganic substance-laminated sheet was produced as described above. The inorganic substance-laminated sheet of this comparative example A was composed of a laminate sheet free of phase-separated structures and an inorganic substance layer of [inorganic A] laminated thereon and had poorer gas barrier properties as compared with Examples A6 to A17, A21, A22, and A23 where an inorganic substance layer was formed in a similar way on a substrate layer having a phase-separated structure.

Comparative Example A3

Formation of Substrate Layer of Sheet

The same procedure as in Comparative example A1 was carried out to produce a laminate sheet having a substrate layer free of phase-separated structures.
(Formation of Inorganic Substance Layer)

The same procedure as in Example A19 was carried out to produce an inorganic substance layer, specifically an [inorganic B] layer, with a layer thickness of 150 nm on the substrate layer of the aforementioned sheet.
(Inorganic Substance-Laminated Sheet)

An inorganic substance-laminated sheet was produced as described above. The inorganic substance-laminated sheet of this comparative example was composed of a laminate sheet free of phase-separated structures and an inorganic substance layer of [inorganic B] laminated thereon and had poorer gas barrier properties as compared with Example A19 where an inorganic substance layer was formed in a similar way on a substrate layer having a phase-separated structure.

Comparative Example A4

Formation of Substrate Layer of Sheet

The same procedure as in Comparative example A1 was carried out to produce a laminate sheet having a substrate layer free of phase-separated structures.
(Formation of Inorganic Substance Layer)

The same procedure as in Example A20 was carried out to produce an inorganic substance layer containing an aluminum compound with a layer thickness of 20 nm on the substrate layer of the aforementioned sheet.

(Inorganic Substance-Laminated Sheet)

An inorganic substance-laminated sheet was produced as described above. The inorganic substance-laminated sheet of this comparative example was composed of a laminate sheet free of phase-separated structures and an inorganic substance layer of an aluminum compound laminated thereon and had poorer gas barrier properties as compared with Example A20 where an inorganic substance layer was formed in a similar way on a substrate layer having a phase-separated structure.

Comparative Example A5

Formation of Substrate Layer of Sheet

Polyethylene terephthalate film (trade name: Lumirror (registered trademark) U48, manufactured by Toray Industries, Inc.) with a thickness of 50 μm was adopted.

Methyl methacrylate and polystyrene adopted as components for sheet formation were mixed at a ratio of 50/50 [mass ratio] and azobisisobutyronitrile was added as thermal polymerization initiator in an amount of 0.5 mass % relative to methyl methacrylate, thereby preparing a coating liquid for sheet formation.

Subsequently, the coating liquid for sheet formation was heated at 80° C. for 60 minutes to perform polymerization, thereby forming a sheet with a thickness of 50 μm. This sheet was a monolayer constitute free of crosslinked components that was produced from components in a non-mutually dissolved state and had a sea-island type phase-separated structure with a structural period of 104 μm. This structural period was more than 100 μm when measured by method B.

(Formation of Inorganic Substance Layer)

The same procedure as in Example A6 was carried out to produce an inorganic substance layer, specifically an [inorganic A] layer, with a layer thickness of 150 nm on the aforementioned sheet.

(Inorganic Substance-Laminated Sheet)

An inorganic substance-laminated sheet was produced as described above. Though the sheet had a sea-island type phase-separated structure, the inorganic substance-laminated sheet of this comparative example had a structural period of 104 μm, which was larger than the intended range, and accordingly had poorer gas barrier properties as compared with Example A6 where an inorganic substance layer was formed in a similar way.

TABLE 1

| | sheet | | | | | | inorganic substance | | |
|---|---|---|---|---|---|---|---|---|---|
| | sheet (monolayer) or substrate layer (in laminate) | | | | | | layer | | water vapor |
| sheet constitution | base (*1) | dispersed structure | structural period [μm] | cross-linked component | production process | | type (*3) | thickness [nm] | permeability [g/(m² · 24 h · atm)] |
| | | | | | process (*2) | conditions | | | |
| Example A1 | monolayer | — | sea-island structure (phase-separated structure) | 96 | absent | B | heat | silicon compound based layer | 100 | $8.9 \times 10^{-2}$ |
| Example A2 | monolayer | — | sea-island structure (phase-separated structure) | 54 | absent | B | heat | silicon compound based layer | 100 | $7.2 \times 10^{-2}$ |
| Example A3 | monolayer | — | sea-island structure (phase-separated structure) | 45 | absent | B | heat | silicon compound based layer | 100 | $3.7 \times 10^{-2}$ |
| Example A4 | monolayer | — | sea-island structure (phase-separated structure) | 1.3 | absent | B | heat | silicon compound based layer | 100 | $2.4 \times 10^{-2}$ |
| Example A5 | laminate | PET | sea-island structure (phase-separated structure) | 0.7 | absent | A | ultraviolet ray | silicon compound based layer | 100 | $8.8 \times 10^{-3}$ |
| Example A6 | laminate | PET | sea-island structure (phase-separated structure) | 0.7 | absent | A | ultraviolet ray | inorganic A-layer | 150 | $2.1 \times 10^{-3}$ |
| Example A7 | laminate | PET | co-continuous structure (phase-separated structure) | 0.15 | absent | A | ultraviolet ray | inorganic A-layer | 150 | $1.0 \times 10^{-3}$ |
| Example A8 | laminate | PET | co-continuous structure (phase-separated structure) | 0.093 | present | A | ultraviolet ray | inorganic A-layer | 150 | $7.3 \times 10^{-4}$ |
| Example A9 | laminate | PET | co-continuous structure (phase-separated structure) | 0.082 | present | A | ultraviolet ray | inorganic A-layer | 150 | $6.8 \times 10^{-4}$ |
| Example A10 | laminate | PET | co-continuous structure (phase-separated structure) | 0.051 | present | A | ultraviolet ray | inorganic A-layer | 150 | $6.4 \times 10^{-4}$ |
| Example A11 | laminate | PET | co-continuous structure (phase-separated structure) | 0.024 | present | A | ultraviolet ray | inorganic A-layer | 150 | $2.5 \times 10^{-4}$ |
| Example A12 | laminate | PET | co-continuous structure (phase-separated structure) | 0.012 | present | A | ultraviolet ray | inorganic A-layer | 150 | $1.5 \times 10^{-4}$ |
| Example A13 | laminate | PET | co-continuous structure (phase-separated structure) | 0.006 | present | A | ultraviolet ray | inorganic A-layer | 150 | $7.6 \times 10^{-4}$ |
| Example A14 | laminate | PET | co-continuous structure (phase-separated structure) | 0.003 | present | A | ultraviolet ray | inorganic A-layer | 150 | $2.7 \times 10^{-3}$ |

TABLE 1-continued

| | sheet | | | | | | | | |
|---|---|---|---|---|---|---|---|---|---|
| | sheet (monolayer) or substrate layer (in laminate) | | | | | | inorganic substance layer | | water vapor permeability |
| | sheet constitution | base (*1) | dispersed structure | structural period [μm] | cross-linked component | production process | | thickness [nm] | [g/(m² · 24 h · atm)] |
| | | | | | | process (*2) | conditions | type (*3) | |
| Example A15 | laminate | PET | co-continuous structure (phase-separated structure) | 0.051 | present | A | ultraviolet ray | inorganic A-layer | 120 | $8.6 \times 10^{-4}$ |
| Example A16 | laminate | PET | co-continuous structure (phase-separated structure) | 0.051 | present | A | ultraviolet ray | inorganic A-layer | 100 | $4.0 \times 10^{-3}$ |
| Example A17 | laminate | PET | co-continuous structure (phase-separated structure) | 0.051 | present | A | ultraviolet ray | inorganic A-layer | 50 | $1.1 \times 10^{-2}$ |
| Example A18 | laminate | PET | co-continuous structure (phase-separated structure) | 0.051 | present | A | ultraviolet ray | inorganic A-layer | 15 | $1.8 \times 10^{-1}$ |
| Example A19 | laminate | PET | co-continuous structure (phase-separated structure) | 0.051 | present | A | ultraviolet ray | inorganic B-layer | 150 | $8.2 \times 10^{-4}$ |
| Example A20 | laminate | PET | co-continuous structure (phase-separated structure) | 0.051 | present | A | ultraviolet ray | aluminum compound based layer | 20 | $3.6 \times 10^{-1}$ |
| Example A21 | laminate | PEN | co-continuous structure (phase-separated structure) | 0.051 | present | A | ultraviolet ray | inorganic A-layer | 150 | $5.6 \times 10^{-4}$ |
| Example A22 | laminate | COC | co-continuous structure (phase-separated structure) | 0.051 | present | A | ultraviolet ray | inorganic A-layer | 150 | $4.6 \times 10^{-4}$ |
| Example A23 | laminate | COP | co-continuous structure (phase-separated structure) | 0.051 | present | A | ultraviolet ray | inorganic A-layer | 150 | $4.7 \times 10^{-4}$ |
| Comparative example A1 | laminate | PET | absent (mutually dissolved state) | — | present | A | ultraviolet ray | silicon compound based layer | 100 | $3.8 \times 10^{-1}$ |
| Comparative example A2 | laminate | PET | absent (mutually dissolved state) | — | present | A | ultraviolet ray | inorganic A-layer | 150 | $7.2 \times 10^{-2}$ |
| Comparative example A3 | laminate | PET | absent (mutually dissolved state) | — | present | A | ultraviolet ray | inorganic B-layer | 150 | $5.5 \times 10^{-2}$ |
| Comparative example A4 | laminate | PET | absent (mutually dissolved state) | — | present | A | ultraviolet ray | aluminum compound based layer | 20 | 2.3 |
| Comparative example A5 | monolayer | — | sea-island structure (phase-separated structure) | 104 | absent | B | heat | inorganic A-layer | 150 | $6.1 \times 10^{-2}$ |

(*1) Details are as follows:
PET: polyethylene terephthalate
PEN: polyethylene naphthalate
COC: cycloolefin copolymer resin
COP: cycloolefin resin
(*2) Details are as follows:
A: Including a step for forming a phase-separated structure via a mutually dissolved state of components for sheet formation
B: Not including a step for forming a phase-separated structure via a mutually dissolved state of components for sheet formation
(*3) Details are as follows:
Inorganic A-layer: A layer of a phase in which zinc oxide, silicon dioxide, and aluminum oxide coexist.
Inorganic B-layer: A layer of a phase in which zinc sulfide and silicon dioxide coexist.

Example B1

Formation of Substrate Layer of Sheet (ii)

Polyethylene terephthalate film (trade name: Lumirror (registered trademark) U48, manufactured by Toray Industries, Inc.) with a thickness of 50 μm was used as base.

Then, methyl methacrylate and polystyrene adopted as components for substrate layer formation were mixed at a ratio of 90/10 [mass ratio] and azobisisobutyronitrile was added as thermal polymerization initiator in an amount of 0.5 mass % relative to methyl methacrylate. Furthermore, a mixed solvent of toluene and acetone mixed at 50/50 [mass %] was added for dilution to a solid content of 10 mass %, thereby preparing a coating liquid for substrate layer formation.

Following this, the coating liquid for substrate layer formation was applied to a base with a Micro Gravure Coater (gravure line number 80R, gravure rotation ratio 100%), and heated at 80° C. for 60 minutes to perform polymerization to form a substrate layer with a thickness of 1 μm, thereby producing a laminate sheet (sheet (ii)). This laminate sheet (sheet (ii)) was one free of crosslinked components and produced from components in a non-mutually dissolved state and it had a sea-island type phase-separated structure with a structural period of 96 μm.

(Formation of Inorganic Substance Layer)

A sputtering target of sintered silicon dioxide was set in a sputtering/chemical vapor deposition apparatus (hereinafter abbreviated as sputtering CVD apparatus).

Argon gas was introduced to adjust the degree of vacuum in the sputtering CVD apparatus to 2×10-1 Pa, and a power of 500 W was applied by a high frequency power source to generate argon gas plasma so that an inorganic substance layer of a silicon compound with a layer thickness of 100 nm would be formed by sputtering of the substrate layer of sheet (ii).

(Inorganic Substance-Laminated Sheet)

A substrate layer and an inorganic substance layer were formed on a base as described above to produce an inorganic substance-laminated sheet. The substrate layer in the inorganic substance-laminated sheet of this example was one free of crosslinked components and produced from components in a non-mutually dissolved state and it had a sea-island type phase-separated structure with a structural period of 96 µm. The inorganic substance layer was one formed mainly of a silicon compound and the inorganic substance-laminated sheet of this example had higher gas barrier properties as compared with Comparative example B1 given below where the sheet used (in a mutually dissolved state) had no phase-separated structure.

Example B2

Formation of Substrate Layer of Sheet (ii)

Polyethylene terephthalate film (trade name: Lumirror (registered trademark) U48, manufactured by Toray Industries, Inc.) with a thickness of 50 µm was used as base.

Then, methyl methacrylate and polystyrene adopted as components for substrate layer formation were mixed at a ratio of 85/15 [mass ratio] and azobisisobutyronitrile was added as thermal polymerization initiator in an amount of 0.5 mass % relative to methyl methacrylate. Furthermore, a mixed solvent of toluene and acetone mixed at 50/50 [mass ratio] was added for dilution to a solid content of 10 mass %, thereby preparing a coating liquid for substrate layer formation.

Following this, the coating liquid for substrate layer formation was applied to a base with a Micro Gravure Coater (gravure line number 80R, gravure rotation ratio 100%), and heated at 80° C. for 60 minutes to perform polymerization to form a substrate layer with a thickness of 1 µm. This substrate layer was one free of crosslinked components and produced from components in a non-mutually dissolved state and it had a sea-island type phase-separated structure with a structural period of 54 µm.
(Formation of Inorganic Substance Layer)

The same procedure as in Example B1 was carried out to produce an inorganic substance layer of a silicon compound with a layer thickness of 100 nm on the aforementioned substrate layer of sheet (ii).
(Inorganic Substance-Laminated Sheet)

A substrate layer and an inorganic substance layer were formed on a base as described above to produce an inorganic substance-laminated sheet. The substrate layer in the inorganic substance-laminated sheet of this example was one free of crosslinked components and produced from components in a non-mutually dissolved state and it had a sea-island type phase-separated structure with a structural period of 54 µm. The inorganic substance layer was one formed mainly of a silicon compound and the inorganic substance-laminated sheet of this example had higher gas barrier properties as compared with Comparative example B1 given below.

Example B3

Formation of Substrate Layer of Sheet (ii)

Polyethylene terephthalate film (trade name: Lumirror (registered trademark) U48, manufactured by Toray Industries, Inc.) with a thickness of 50 µm was used as base.

Then, methyl methacrylate and polystyrene adopted as components for substrate layer formation were mixed at a ratio of 80/20 [mass ratio] and azobisisobutyronitrile was added as thermal polymerization initiator in an amount of 0.5 mass % relative to methyl methacrylate. Furthermore, a mixed solvent of toluene and acetone mixed at 50/50 [mass ratio] was added for dilution to a solid content of 10 mass %, thereby preparing a coating liquid for substrate layer formation.

Following this, the coating liquid for substrate layer formation was applied to a base with a Micro Gravure Coater (gravure line number 80R, gravure rotation ratio 100%), heated at 80° C. for 60 minutes to perform polymerization to form a substrate layer with a thickness of 1 µm, thereby producing a laminate sheet (sheet (ii)). This laminate sheet (sheet (ii)) was one free of crosslinked components and produced from components in a non-mutually dissolved state and it had a sea-island type phase-separated structure with a structural period of 45 µm.
(Formation of Inorganic Substance Layer)

The same procedure as in Example B1 was carried out to produce an inorganic substance layer of a silicon compound with a layer thickness of 100 nm on the aforementioned substrate layer of sheet (ii).
(Inorganic Substance-Laminated Sheet)

A substrate layer and an inorganic substance layer were formed on a base as described above to produce an inorganic substance-laminated sheet. The substrate layer in the inorganic substance-laminated sheet of this example was one free of crosslinked components and produced from components in a non-mutually dissolved state and it had a sea-island type phase-separated structure with a structural period of 45 µm. The inorganic substance layer was one formed mainly of a silicon compound and the inorganic substance-laminated sheet of this example had higher gas barrier properties as compared with Examples B1 and B2 because the phase-separated structure in the substrate layer had a structural period in a preferable range.

Example B4

Formation of Substrate Layer of Sheet (ii)

Polyethylene terephthalate film (trade name: Lumirror (registered trademark) U48, manufactured by Toray Industries, Inc.) with a thickness of 50 µm was used as base.

Then, methyl methacrylate and polystyrene adopted as components for substrate layer formation were mixed at a ratio of 70/30 [mass ratio] and azobisisobutyronitrile was added as thermal polymerization initiator in an amount of 0.5 mass % relative to methyl methacrylate. Furthermore, a mixed solvent of toluene and acetone mixed at 50/50 [mass ratio] was added for dilution to a solid content of 10 mass %, thereby preparing a coating liquid for substrate layer formation.

Following this, the coating liquid for substrate layer formation was applied to a base with a Micro Gravure Coater (gravure line number 80R, gravure rotation ratio 100%), heated at 80° C. for 60 minutes to perform polymerization to form a substrate layer with a thickness of 1 µm, thereby producing a laminate sheet (sheet (ii)). This laminate sheet (sheet (ii)) was one free of crosslinked components and produced from components in a non-mutually dissolved state and it had a sea-island type phase-separated structure with a structural period of 1.3 µm.
(Formation of Inorganic Substance Layer)

The same procedure as in Example B1 was carried out to produce an inorganic substance layer of a silicon compound with a layer thickness of 100 nm on the aforementioned substrate layer of sheet (ii).
(Inorganic Substance-Laminated Sheet)

A substrate layer and an inorganic substance layer were formed on a base as described above to produce an inorganic substance-laminated sheet. The substrate layer in the inorganic substance-laminated sheet of this example was one free of crosslinked components and produced from components in a non-mutually dissolved state and it had a sea-island type phase-separated structure with a structural period of 1.3 µm. The inorganic substance layer was one formed mainly of a silicon compound and the inorganic substance-laminated sheet of this example had higher gas barrier properties as compared with Examples B1 and B2 because the phase-separated structure in the substrate layer had a structural period in a preferable range.

Example B5

Formation of Substrate Layer of Sheet (ii)

Polyethylene terephthalate film (trade name: Lumirror (registered trademark) U48, manufactured by Toray Industries, Inc.) with a thickness of 50 µm was used as base.

Subsequently, methyl acrylate and polymethyl methacrylate (PMMA) adopted as components for substrate layer formation were mixed at a ratio of 10/90 [mass ratio] and 2-methyl 1-[4-(methylthio)phenyl]-2-morpholinopropane-1-one (IRGACURE 907, manufactured by BASF) and 2-benzyl-2-dimethylamino-1-(4-morpholinophenyl) butanone-1 (IRGACURE 369 manufactured by BASF) were added as photopolymerization initiators each in an amount of 2.5 mass % (a total of 5 mass %) relative to methyl acrylate. Then, a solvent of ethyl acetate and cyclohexanone mixed at a ratio of 70/30 [mass ratio] was added to dilute the mixture to a solid content of 10 mass %, thereby preparing a coating liquid for substrate layer formation.

Following this, the coating liquid for substrate layer formation was applied to a base with a Micro Gravure Coater (gravure line number 80R, gravure rotation ratio 100%), dried by heating at 80° C. for 30 seconds, and polymerized by application of ultraviolet ray at 0.8 J/cm2 to form a substrate layer with a thickness of 1 µm, thereby producing a laminate sheet (sheet (ii)). The substrate layer of sheet (ii) was free of crosslinked components, but a phase-separated structure was formed by irradiating the components with ultraviolet ray, i.e. a kind of electromagnetic wave, while they were in a mutually dissolved state, and it was found to contain a sea-island type phase-separated structure with a structural period of 0.7 µm.
(Formation of Inorganic Substance Layer)

The same procedure as in Example B1 was carried out to produce an inorganic substance layer of a silicon compound with a layer thickness of 100 nm on the aforementioned substrate layer of sheet (ii).
(Inorganic Substance-Laminated Sheet)

A substrate layer and an inorganic substance layer were formed on a base as described above to produce an inorganic substance-laminated sheet. The substrate layer in the inorganic substance-laminated sheet of this example was free of crosslinked components, but a phase-separated structure was formed by irradiating the components with ultraviolet ray, i.e. a kind of electromagnetic wave, while they were in a mutually dissolved state, and it was found to contain a sea-island type phase-separated structure with a smaller structural period of 0.7 µm as compared with Examples B1 to B4. The inorganic substance layer was one formed mainly of a silicon compound and the inorganic substance-laminated sheet of this example had higher gas barrier properties as compared with Examples B1 to B4 because the phase-separated structure in the substrate layer had a structural period in a still more preferable range than in Examples B1 to B4.

Example B6

Formation of Substrate Layer of Sheet (ii)

The same procedure as in Example B5 was carried out to produce a laminate sheet (sheet (ii)) that was free of crosslinked components, but had a substrate layer with a thickness of 1 µm in which a phase-separated structure had been formed by irradiating the components with ultraviolet ray, i.e. a kind of electromagnetic wave, while they were in a mutually dissolved state, and it was found to contain a sea-island type phase-separated structure with a structural period of 0.7 µm.
(Formation of Inorganic Substance Layer)

A sputtering target of a sintered mixture of zinc oxide, silicon dioxide, and aluminum oxide (composition ratio by mass among zinc oxide, silicon dioxide, and aluminum oxide was 77.0/20.0/3.0) was set in a sputtering CVD apparatus.

A mixture of argon gas and oxygen gas with an oxygen gas partial pressure of 10% was then introduced to adjust the degree of vacuum in the sputtering CVD apparatus to 2×10-1 Pa, and a power of 500 W was applied by a direct current power source to generate argon-oxygen gas plasma so that an inorganic substance layer, specifically [inorganic A] layer, with a layer thickness of 150 nm would be formed by sputtering of the aforementioned substrate layer. With respect to the composition of this inorganic substance layer, ZnO was found to account for 71.2 mass %, $Al_2O_3$ for 3.7 mass %, SiO2 for 25.1 mass %, and ZnO and $Al_2O_3$ together for 74.9 mass %.
(Inorganic Substance-Laminated Sheet)

A substrate layer and an inorganic substance layer were formed on a base as described above to produce an inorganic substance-laminated sheet. The inorganic substance layer was an [inorganic A] layer and the inorganic substance-laminated sheet of this example, which had an inorganic substance layer according to a preferable embodiment, had still higher gas barrier properties as compared with Example B5 and Comparative example B2 where the sheet used (in a mutually dissolved state) as substrate layer had no phase-separated structure.

Example B7

Formation of Substrate Layer of Sheet (ii)

Polyethylene terephthalate film (trade name: Lumirror (registered trademark) U48, manufactured by Toray Industries, Inc.) with a thickness of 50 µm was used as base.

Subsequently, methyl acrylate and polymethyl methacrylate (PMMA) adopted as components for substrate layer formation were mixed at a ratio of 20/80 [mass ratio] and 2-methyl 1-[4-(methylthio)phenyl]-2-morpholinopropane-1-one (IRGACURE 907, manufactured by BASF) and 2-benzyl-2-dimethylamino-1-(4-morpholinophenyl) butanone-1 (IRGACURE 369 manufactured by BASF) were added as photopolymerization initiators each in an amount of 2.5 mass % (a total of 5 mass %) relative to methyl acrylate. Then, a solvent of ethyl acetate and cyclohexanone mixed at a ratio of 70/30 [mass ratio] was added to dilute the mixture to a solid content of 10 mass %, thereby preparing a coating liquid for substrate layer formation.

Following this, the coating liquid for substrate layer formation was applied to a base with a Micro Gravure Coater (gravure line number 80R, gravure rotation ratio 100%), dried by heating at 80° C. for 30 seconds, and polymerized by application of ultraviolet ray at 0.8 J/cm2 to form a substrate layer with a thickness of 1 µm, thereby producing a laminate sheet (sheet (ii)). The substrate layer of sheet (ii) was free of crosslinked components, but a phase-separated structure was formed by irradiating the components with ultraviolet ray, i.e. a kind of electromagnetic wave, while they were in a mutually dissolved state, and it was found to contain a co-continuous type phase-separated structure with a structural period of 0.15 µm.

(Formation of Inorganic Substance Layer)

The same procedure as in Example B6 was carried out to produce an inorganic substance layer, specifically an [inorganic A] layer, with a layer thickness of 150 nm on the substrate layer of sheet (ii).

(Inorganic Substance-Laminated Sheet)

A substrate layer and an inorganic substance layer were formed on a base as described above to produce an inorganic substance-laminated sheet. The substrate layer in the inorganic substance-laminated sheet of this example was free of crosslinked components, but a phase-separated structure was formed by irradiating the components of the substrate layer, which were different from those used in Example B6, with ultraviolet ray, i.e. a kind of electromagnetic wave, while they were in a mutually dissolved state, and it was found to contain a co-continuous type phase-separated structure having not only a smaller structural period of 0.15 µm, but also a different structural shape, as compared with Example B6. Furthermore, the inorganic substance layer was an [inorganic A] layer, and the gas barrier properties of the inorganic substance-laminated sheet of this example were able to be controlled as compared with Example B6 as result of a co-continuous type phase-separated structure, unlike the phase-separated structure formed in Example B6, being formed in the substrate layer.

Example B8

Formation of Substrate Layer of Sheet (ii)

Polyethylene terephthalate film (trade name: Lumirror (registered trademark) U48, manufactured by Toray Industries, Inc.) with a thickness of 50 µm was used as base.

Subsequently, dipentaerythritol hexaacrylate and polymethyl methacrylate (PMMA) adopted as components for substrate layer formation were mixed at a ratio of 20/80 [mass ratio] and 2-methyl 1-[4-(methylthio)phenyl]-2-morpholinopropane-1-one (IRGACURE 907, manufactured by BASF) and 2-benzyl-2-dimethylamino-1-(4-morpholinophenyl) butanone-1 (IRGACURE 369 manufactured by BASF) were added as photopolymerization initiators each in an amount of 2.5 mass % (a total of 5 mass %) relative to dipentaerythritol hexaacrylate. Then, a solvent of ethyl acetate and cyclohexanone mixed at a ratio of 70/30 [mass ratio] was added to dilute the mixture to a solid content of 10 mass %, thereby preparing a coating liquid for substrate layer formation.

Following this, the coating liquid for substrate layer formation was applied to a base with a Micro Gravure Coater (gravure line number 80R, gravure rotation ratio 100%), dried by heating at 80° C. for 30 seconds, and polymerized by application of ultraviolet ray at 0.8 J/cm2 to form a substrate layer with a thickness of 1 µm, thereby producing a laminate sheet (sheet (ii)). The substrate layer of sheet (ii) contained crosslinked components, and a phase-separated structure was formed by irradiating the components with ultraviolet ray, i.e. a kind of electromagnetic wave, while they were in a mutually dissolved state, and it was found to contain a co-continuous type phase-separated structure with a structural period of 0.093 µm.

(Formation of Inorganic Substance Layer)

The same procedure as in Example B6 was carried out to produce an inorganic substance layer, specifically an [inorganic A] layer, with a layer thickness of 150 nm on the substrate layer of sheet (ii).

(Inorganic Substance-Laminated Sheet)

A substrate layer and an inorganic substance layer were formed on a base as described above to produce an inorganic substance-laminated sheet. The substrate layer in the inorganic substance-laminated sheet of this example, unlike Example B7, contained a crosslinked component, but a phase-separated structure was formed by irradiating the components of the substrate layer with ultraviolet ray, i.e. a kind of electromagnetic wave, while they were in a mutually dissolved state, and it was found to contain a co-continuous type phase-separated structure with a smaller structural period of 0.093 µm as compared with Example B7. The inorganic substance layer was an [inorganic A] layer and the inorganic substance-laminated sheet of this example had higher gas barrier properties as compared with Example B7 because the phase-separated structure in the substrate layer had a structural period in a still more preferable range than in Example B7.

Example B9

Formation of Substrate Layer of Sheet (ii)

Polyethylene terephthalate film (trade name: Lumirror (registered trademark) U48, manufactured by Toray Industries, Inc.) with a thickness of 50 µm was used as base.

Subsequently, dipentaerythritol hexaacrylate and polymethyl methacrylate (PMMA) adopted as components for substrate layer formation were mixed at a ratio of 80/20 [mass ratio] and 2-methyl 1-[4-(methylthio)phenyl]-2-morpholinopropane-1-one (IRGACURE 907, manufactured by BASF) and 2-benzyl-2-dimethylamino-1-(4-morpholinophenyl) butanone-1 (IRGACURE 369 manufactured by BASF) were added as photopolymerization initiators each in an amount of 2.5 mass % (a total of 5 mass %) relative to dipentaerythritol hexaacrylate. Then, a solvent of ethyl acetate and cyclohexanone mixed at a ratio of 70/30 [mass ratio] was added to dilute the mixture to a solid content of 10 mass %, thereby preparing a coating liquid for substrate layer formation.

Following this, the coating liquid for substrate layer formation was applied to a base with a Micro Gravure Coater (gravure line number 80R, gravure rotation ratio 100%), dried by heating at 80° C. for 30 seconds, and polymerized by application of ultraviolet ray at 0.8 J/cm2 to form a substrate layer with a thickness of 1 µm, thereby producing a laminate sheet (sheet (ii)). The substrate layer of sheet (ii) contained crosslinked components, and a phase-separated structure was formed by irradiating the components with ultraviolet ray, i.e. a kind of electromagnetic wave, while they were in a mutually dissolved state, and it was found to contain a co-continuous type phase-separated structure with a structural period of 0.082 µm.

(Formation of Inorganic Substance Layer)

The same procedure as in Example B6 was carried out to produce an inorganic substance layer, specifically an [inorganic A] layer, with a layer thickness of 150 nm on the substrate layer of sheet (ii).

(Inorganic Substance-Laminated Sheet)

A substrate layer and an inorganic substance layer were formed on a base as described above to produce an inorganic substance-laminated sheet. The substrate layer in the inorganic substance-laminated sheet of this example contained a crosslinked component, and a phase-separated structure was formed by irradiating the components of the substrate layer mixed at a component ratio different from that in Example B8 with ultraviolet ray, i.e. a kind of electromagnetic wave, while they were in a mutually dissolved state, and it was found to contain a co-continuous type phase-separated structure with a smaller structural period of 0.082 µm as compared with Examples B7. Furthermore, the inorganic substance layer was an [inorganic A] layer, and the gas barrier properties of the inorganic substance-laminated sheet of this example were able to be controlled as result of altering the component ratio in the substrate layer from Example B8 though the same components were contained.

Example B10

Formation of Substrate Layer of Sheet (ii)

Polyethylene terephthalate film (trade name: Lumirror (registered trademark) U48, manufactured by Toray Industries, Inc.) with a thickness of 50 µm was used as base.

Subsequently, pentaerythritol tetraacrylate and polymethyl methacrylate (PMMA) adopted as components for substrate layer formation were mixed at a ratio of 80/20 [mass ratio] and 2-methyl 1-[4-(methylthio)phenyl]-2-morpholinopropane-1-one (IRGACURE 907, manufactured by BASF) and 2-benzyl-2-dimethylamino-1-(4-morpholinophenyl) butanone-1 (IRGACURE 369 manufactured by BASF) were added as photopolymerization initiators each in an amount of 2.5 mass % (a total of 5 mass %) relative to pentaerythritol tetraacrylate. Then, a solvent of ethyl acetate and cyclohexanone mixed at a ratio of 70/30 [mass ratio] was added to dilute the mixture to a solid content of 10 mass %, thereby preparing a coating liquid for substrate layer formation.

Following this, the coating liquid for substrate layer formation was applied to a base with a Micro Gravure Coater (gravure line number 80R, gravure rotation ratio 100%), dried by heating at 80° C. for 30 seconds, and polymerized by application of ultraviolet ray at 0.8 J/cm2 to form a substrate layer with a thickness of 1 µm, thereby producing a laminate sheet (sheet (ii)). The substrate layer of sheet (ii) contained crosslinked components, and a phase-separated structure was formed by irradiating the components with ultraviolet ray, i.e. a kind of electromagnetic wave, while they were in a mutually dissolved state, and it was found to contain a co-continuous type phase-separated structure with a structural period of 0.051 µm.

(Formation of Inorganic Substance Layer)

The same procedure as in Example B6 was carried out to produce an inorganic substance layer, specifically an [inorganic A] layer, with a layer thickness of 150 nm on the substrate layer of sheet (ii).

(Inorganic Substance-Laminated Sheet)

A substrate layer and an inorganic substance layer were formed on a base as described above to produce an inorganic substance-laminated sheet. The substrate layer in the inorganic substance-laminated sheet of this example contained a crosslinked component, and a phase-separated structure was formed by irradiating the components of the substrate layer, which were different from those used in Example B9, with ultraviolet ray, i.e. a kind of electromagnetic wave, while they were in a mutually dissolved state, and it was found to contain a co-continuous type phase-separated structure with a smaller structural period of 0.051 µm as compared with Examples B9. Furthermore, the inorganic substance layer was an [inorganic A] layer, and the gas barrier properties of the inorganic substance-laminated sheet of this example were able to be controlled as result of altering the component in the substrate layer from Example B9, though the component ratio remained the same, so as to change the structural period of the phase-separated structure.

Example B11

Formation of Substrate Layer of Sheet (ii)

Except for polymerizing a substrate layer by irradiation with ultraviolet ray at 1.9 J/cm2, the same procedure as in Example B10 was carried out to produce a substrate layer with a thickness of 1 µm on a base, thereby preparing laminate sheet (sheet (ii)). The substrate layer contained crosslinked components, and a phase-separated structure was formed by irradiating the components with an altered cumulative dose of ultraviolet ray, i.e. a kind of electromagnetic wave, while they were in a mutually dissolved state, and it was found to contain a co-continuous type phase-separated structure with a structural period of 0.024 µm.

(Formation of Inorganic Substance Layer)

The same procedure as in Example B6 was carried out to produce an inorganic substance layer, specifically an [inorganic A] layer, with a layer thickness of 150 nm on the substrate layer of sheet (ii).

(Inorganic Substance-Laminated Sheet)

A substrate layer and an inorganic substance layer were formed on a base as described above to produce an inorganic substance-laminated sheet. The substrate layer in the inorganic substance-laminated sheet of this example contained a crosslinked component, and a phase-separated structure was formed by irradiating the components of the substrate layer with a larger dose of ultraviolet ray, i.e. a kind of electromagnetic wave, than in Example B10, while they were in a mutually dissolved state, and it was found to contain a co-continuous type phase-separated structure with a smaller structural period of 0.024 µm as compared with Examples B10. The inorganic substance layer was an [inorganic A] layer and the inorganic substance-laminated sheet of this example had higher gas barrier properties as compared with Example B10 because the phase-separated structure in the substrate layer had a structural period in a still more preferable range than in Example B10.

Example B12

Formation of Substrate Layer of Sheet (ii)

Polyethylene terephthalate film (trade name: Lumirror (registered trademark) U48, manufactured by Toray Industries, Inc.) with a thickness of 50 µm was used as base.

Subsequently, pentaerythritol tetraacrylate and polymethyl methacrylate (PMMA) adopted as components for substrate layer formation were mixed at a ratio of 90/10 [mass ratio] and 2-methyl 1-[4-(methylthio)phenyl]-2-morpholinopropane-1-one (IRGACURE 907, manufactured by BASF) and 2-benzyl-2-dimethylamino-1-(4-morpholinophenyl) butanone-1 (IRGACURE 369 manufactured by BASF) were added as photopolymerization initiators each in an amount of 2.5 mass % (a total of 5 mass %) relative to pentaerythritol tetraacrylate. Then, a solvent of ethyl acetate and cyclohexanone mixed at a ratio of 70/30 [mass ratio] was added to dilute the mixture to a solid content of 10 mass %, thereby preparing a coating liquid for substrate layer formation.

Following this, the coating liquid for substrate layer formation was applied to a base with a Micro Gravure Coater (gravure line number 80R, gravure rotation ratio 100%), dried by heating at 80° C. for 30 seconds, and polymerized by application of ultraviolet ray at 0.8 J/cm2 to form a substrate layer with a thickness of 1 μm, thereby producing a laminate sheet (sheet (ii)). The substrate layer of sheet (ii) contained crosslinked components, and a phase-separated structure was formed by irradiating the components with ultraviolet ray, i.e. a kind of electromagnetic wave, while they were in a mutually dissolved state, and it was found to contain a co-continuous type phase-separated structure with a structural period of 0.012 μm.

(Formation of Inorganic Substance Layer)

The same procedure as in Example B6 was carried out to produce an inorganic substance layer, specifically an [inorganic A] layer, with a layer thickness of 150 nm on the substrate layer of sheet (ii).

(Inorganic Substance-Laminated Sheet)

A substrate layer and an inorganic substance layer were formed on a base as described above to produce an inorganic substance-laminated sheet. The substrate layer in the inorganic substance-laminated sheet of this example contained a crosslinked component, and a phase-separated structure was formed by irradiating the components of the substrate layer mixed at a constituent ratio different from that in Example B10 with ultraviolet ray, i.e. a kind of electromagnetic wave, while they were in a mutually dissolved state, and it was found to contain a co-continuous type phase-separated structure with a smaller structural period of 0.012 μm as compared with Examples B10 and B11. The inorganic substance layer was an [inorganic A] layer and the inorganic substance-laminated sheet of this example had higher gas barrier properties as compared with Example B10 because the component ratio in the substrate layer had been altered so that the phase-separated structure in the substrate layer would be able to have a structural period adjusted in a preferable range without altering the conditions for ultraviolet ray irradiation with the components while in a mutually dissolved state as in Example B11.

Example B13

Formation of Substrate Layer of Sheet (ii)

Except for polymerizing a substrate layer by irradiation with ultraviolet ray at 1.9 J/cm2, the same procedure as in Example B12 was carried out to produce a substrate layer with a thickness of 1 μm on a base, thereby preparing laminate sheet (sheet (ii)). The substrate layer contained crosslinked components, and a phase-separated structure was formed by irradiating the components with an altered cumulative dose of ultraviolet ray, i.e. a kind of electromagnetic wave, while they were in a mutually dissolved state, and it was found to contain a co-continuous type phase-separated structure with a structural period of 0.006 μm.

(Formation of Inorganic Substance Layer)

The same procedure as in Example B6 was carried out to produce an inorganic substance layer, specifically an [inorganic A] layer, with a layer thickness of 150 nm on the substrate layer of sheet (ii).

(Inorganic Substance-Laminated Sheet)

A substrate layer and an inorganic substance layer were formed on a base as described above to produce an inorganic substance-laminated sheet. The substrate layer in the inorganic substance-laminated sheet of this example contained a crosslinked component, and a phase-separated structure was formed by irradiating the components of the substrate layer with a larger dose of ultraviolet ray, i.e. a kind of electromagnetic wave, than in Example B12, while they were in a mutually dissolved state, and it was found to contain a co-continuous type phase-separated structure with a smaller structural period of 0.006 μm as compared with Example B12. Furthermore, the inorganic substance layer was an [inorganic A] layer, and the gas barrier properties of the inorganic substance-laminated sheet of this example were able to be controlled because the phase-separated structure in the substrate layer had a smaller structural period than in Example B12.

Example B14

Formation of Substrate Layer of Sheet (ii)

Polyethylene terephthalate film (trade name: Lumirror (registered trademark) U48, manufactured by Toray Industries, Inc.) with a thickness of 50 μm was used as base.

Subsequently, trimethylolpropane triacrylate and polymethyl methacrylate (PMMA) adopted as components for substrate layer formation were mixed at a ratio of 80/20 [mass ratio] and 2-methyl 1-[4-(methylthio)phenyl]-2-morpholinopropane-1-one (IRGACURE 907, manufactured by BASF) and 2-benzyl-2-dimethylamino-1-(4-morpholinophenyl) butanone-1 (IRGACURE 369 manufactured by BASF) were added as photopolymerization initiators each in an amount of 2.5 mass % (a total of 5 mass %) relative to trimethylolpropane triacrylate. Then, a solvent of ethyl acetate and cyclohexanone mixed at a ratio of 70/30 [mass ratio] was added to dilute the mixture to a solid content of 10 mass %, thereby preparing a coating liquid for substrate layer formation.

Following this, the coating liquid for substrate layer formation was applied to a base with a Micro Gravure Coater (gravure line number 80R, gravure rotation ratio 100%), dried by heating at 80° C. for 30 seconds, and polymerized by application of ultraviolet ray at 0.8 J/cm2 to form a substrate layer with a thickness of 1 μm, thereby producing a laminate sheet (sheet (ii)). The substrate layer of sheet (ii) contained crosslinked components, and a phase-separated structure was formed by irradiating the components with ultraviolet ray, i.e. a kind of electromagnetic wave, while they were in a mutually dissolved state, and it was found to contain a co-continuous type phase-separated structure with a structural period of 0.003 μm.

(Formation of Inorganic Substance Layer)

The same procedure as in Example B6 was carried out to produce an inorganic substance layer, specifically an [inorganic A] layer, with a layer thickness of 150 nm on the substrate layer of sheet (ii).

(Inorganic Substance-Laminated Sheet)

A substrate layer and an inorganic substance layer were formed on a base as described above to produce an inorganic substance-laminated sheet. The substrate layer in the inorganic substance-laminated sheet of this example contained a crosslinked component, and a phase-separated structure was formed by irradiating the components of the substrate layer with ultraviolet ray, i.e. a kind of electromagnetic wave, while they were in a mutually dissolved state, and it was found to contain a co-continuous type phase-separated structure with a still smaller structural period of 0.003 µm as compared with Example B13. Furthermore, the inorganic substance layer was an [inorganic A] layer, and the gas barrier properties of the inorganic substance-laminated sheet of this example were able to be controlled because the phase-separated structure in the substrate layer had a smaller structural period than in Example B12.

Example B15

Formation of Substrate Layer of Sheet (ii)

The same procedure as in Example B10 was carried out to produce a laminate sheet (sheet (ii)) that had a substrate layer with a thickness of 1 µm formed on a base, in which crosslinked components were included and in which a phase-separated structure had been formed by irradiating the components with ultraviolet ray, i.e. a kind of electromagnetic wave, while they were in a mutually dissolved state, and it was found to contain a co-continuous type phase-separated structure with a structural period of 0.051 µm.
(Formation of Inorganic Substance Layer)
Except for setting the thickness to 120 nm, the same procedure as in Example B6 was carried out to produce an inorganic substance layer, specifically an [inorganic A] layer, on the substrate layer of sheet (ii).
(Inorganic Substance-Laminated Sheet)
A substrate layer and an inorganic substance layer were formed on a base as described above to produce an inorganic substance-laminated sheet. Furthermore, the inorganic substance layer was an [inorganic A] layer, and the gas barrier properties of the inorganic substance-laminated sheet of this example were able to be controlled more effectively than in Example B10 by altering the thickness of the inorganic substance layer.

Example B16

Formation of Substrate Layer of Sheet (ii)

The same procedure as in Example B10 was carried out to produce a laminate sheet (sheet (ii)) that contained a substrate layer with a thickness of 1 µm formed on a base, in which crosslinked components were included and in which a phase-separated structure had been formed by irradiating the components with ultraviolet ray, i.e. a kind of electromagnetic wave, while they were in a mutually dissolved state, and it was found to contain a co-continuous type phase-separated structure with a structural period of 0.051 µm.
[0 300]
(Formation of Inorganic Substance Layer)
Except for setting the thickness to 100 nm, the same procedure as in Example B6 was carried out to produce an inorganic substance layer, specifically an [inorganic A] layer, on the substrate layer of sheet (ii).
(Inorganic Substance-Laminated Sheet)
A substrate layer and an inorganic substance layer were formed on a base as described above to produce an inorganic substance-laminated sheet. Furthermore, the inorganic substance layer was an [inorganic A] layer, and the gas barrier properties of the inorganic substance-laminated sheet of this example were able to be controlled more effectively than in Examples B10 and B15 by altering the thickness of the inorganic substance layer.

Example B17

Formation of Substrate Layer of Sheet (ii)

The same procedure as in Example B10 was carried out to produce a laminate sheet (sheet (ii)) that contained a substrate layer with a thickness of 1 µm formed on a base, in which crosslinked components were included and in which a phase-separated structure had been formed by irradiating the components with ultraviolet ray, i.e. a kind of electromagnetic wave, while they were in a mutually dissolved state, and it was found to contain a co-continuous type phase-separated structure with a structural period of 0.051 µm.
(Formation of Inorganic Substance Layer)
Except for setting the thickness to 50 nm, the same procedure as in Example B6 was carried out to produce an inorganic substance layer, specifically an [inorganic A] layer, on the substrate layer of sheet (ii).
(Inorganic Substance-Laminated Sheet)
A substrate layer and an inorganic substance layer were formed on a base as described above to produce an inorganic substance-laminated sheet. Furthermore, the inorganic substance layer was an [inorganic A] layer, and the gas barrier properties of the inorganic substance-laminated sheet of this example were able to be controlled more effectively than in Examples B10, B15 and B18 by altering the thickness of the inorganic substance layer.

Example B18

Formation of Substrate Layer of Sheet (ii)

The same procedure as in Example B10 was carried out to produce a laminate sheet (sheet (ii)) that contained a substrate layer with a thickness of 1 µm formed on a base, in which crosslinked components were included and in which a phase-separated structure had been formed by irradiating the components with ultraviolet ray, i.e. a kind of electromagnetic wave, while they were in a mutually dissolved state, and it was found to contain a co-continuous type phase-separated structure with a structural period of 0.051 µm.
(Formation of Inorganic Substance Layer)
Except for setting the thickness to 15 nm, the same procedure as in Example B6 was carried out to produce an inorganic substance layer, specifically an [inorganic A] layer, on the substrate layer of sheet (ii).
(Inorganic Substance-Laminated Sheet)
A substrate layer and an inorganic substance layer were formed on a base as described above to produce an inorganic substance-laminated sheet. Furthermore, the inorganic substance layer was an [inorganic A] layer, and the inorganic substance-laminated sheet of this example had poorer gas barrier properties than in Examples B10, B15, B16, and B17 as a result of decreasing the thickness of the inorganic substance layer.

Example B19

Formation of Substrate Layer of Sheet (ii)

The same procedure as in Example B10 was carried out to produce a laminate sheet (sheet (ii)) that contained a substrate layer with a thickness of 1 μm formed on a base, in which crosslinked components were included and in which a phase-separated structure had been formed by irradiating the components with ultraviolet ray, i.e. a kind of electromagnetic wave, while they were in a mutually dissolved state, and it was found to contain a co-continuous type phase-separated structure with a structural period of 0.051 μm.
(Formation of Inorganic Substance Layer)

A sputtering target of a sintered mixture of zinc sulfide and silicon dioxide (composition ratio by mole between zinc sulfide and silicon dioxide was 80/20) was set in a sputtering CVD apparatus.

Argon gas was introduced to adjust the degree of vacuum in the sputtering CVD apparatus to 2×10-1 Pa, and a power of 500 W was applied by a high frequency power source to generate argon gas plasma so that an inorganic substance layer, specifically an [inorganic B] layer, with a layer thickness of 150 nm would be formed by sputtering of the substrate layer. With respect to the composition of this inorganic substance layer, ZnS and $SiO_2$ accounted for 86.7 mass % and 13.3 mass %, respectively.
(Inorganic Substance-Laminated Sheet)

A substrate layer and an inorganic substance layer were formed on a base as described above to produce an inorganic substance-laminated sheet. The inorganic substance layer was an [inorganic B] layer, and the inorganic substance-laminated sheet of this example had a phase-separated structure in the substrate layer and accordingly showed higher gas barrier properties as compared with undermentioned Comparative example B3 where the sheet used (in a mutually dissolved state) contained no phase-separated structure in the substrate layer. High gas barrier properties were achieved in spite of an inorganic substance layer different from that in Example B10.

Example B20

Formation of Substrate Layer of Sheet (ii)

The same procedure as in Example B10 was carried out to produce a laminate sheet (sheet (ii)) that contained a substrate layer with a thickness of 1 μm formed on a base, in which crosslinked components were included and in which a phase-separated structure had been formed by irradiating the components with ultraviolet ray, i.e. a kind of electromagnetic wave, while they were in a mutually dissolved state, and it was found to contain a co-continuous type phase-separated structure with a structural period of 0.051 μm.
(Formation of Inorganic Substance Layer)

A deposition material of aluminum was set in a vacuum deposition apparatus.

Subsequently, using the aforementioned vacuum deposition apparatus, aluminum was evaporated by resistance heating while introducing oxygen gas to perform vacuum deposition, thereby forming an inorganic substance layer, specifically a layer of an aluminum compound, with a layer thickness of 20 nm on the substrate layer.
(Inorganic Substance-Laminated Sheet)

A substrate layer and an inorganic substance layer were formed on a base as described above to produce an inorganic substance-laminated sheet. The inorganic substance layer was one formed mainly of an aluminum compound and the inorganic substance-laminated sheet of this example contained a phase-separated structure in the substrate layer and accordingly had higher gas barrier properties as compared with undermentioned Comparative example B4 where the sheet used (in a mutually dissolved state) had no phase-separated structure in the substrate layer.

Example B21

Formation of Substrate Layer of Sheet (ii)

Polyethylene naphthalate film with a thickness of 50 μm was adopted as base.

Then, the same procedure as in Example B10 was carried out to produce a laminate sheet (sheet (ii)) that contained a substrate layer with a thickness of 1 μm formed on a base, in which crosslinked components were included and in which a phase-separated structure had been formed by irradiating the components with ultraviolet ray, i.e. a kind of electromagnetic wave, while they were in a mutually dissolved state, and it was found to contain a co-continuous type phase-separated structure with a structural period of 0.051 μm.
(Formation of Inorganic Substance Layer)

The same procedure as in Example B6 was carried out to produce an inorganic substance layer, specifically an [inorganic A] layer, with a layer thickness of 150 nm on the substrate layer of sheet (ii).
(Inorganic Substance-Laminated Sheet)

A substrate layer and an inorganic substance layer were formed on a base as described above to produce an inorganic substance-laminated sheet. The inorganic substance-laminated sheet of this example, unlike Example B10, was composed of a base formed of polyethylene naphthalate film on which a substrate layer and an inorganic substance layer had been formed by the same procedure as in Example B10. High gas barrier properties were also achieved in spite of the use of a different base.

Example B22

Formation of Substrate Layer of Sheet (ii)

Cycloolefin copolymer resin film (trade name: F-film F1, manufactured by Gunze Limited) with a thickness of 100 μm was adopted as base.

Then, the same procedure as in Example B10 was carried out to produce a laminate sheet (sheet (ii)) that contained a substrate layer with a thickness of 1 μm formed on a base, in which crosslinked components were included and in which a phase-separated structure had been formed by irradiating the components with ultraviolet ray, i.e. a kind of electromagnetic wave, while they were in a mutually dissolved state, and it was found to contain a co-continuous type phase-separated structure with a structural period of 0.051 μm.
(Formation of Inorganic Substance Layer)

The same procedure as in Example B6 was carried out to produce an inorganic substance layer, specifically an [inorganic A] layer, with a layer thickness of 150 nm on the substrate layer of sheet (ii).
(Inorganic Substance-Laminated Sheet)

A substrate layer and an inorganic substance layer were formed on a base as described above to produce an inorganic substance-laminated sheet. The inorganic substance-laminated sheet of this example, unlike Example B10, was composed of a base formed of cycloolefin copolymer resin film on which a substrate layer and an inorganic substance layer had been formed by the same procedure as in Example B10. High gas barrier properties were also achieved in spite of the use of a different base.

Example B23

Formation of Substrate Layer of Sheet (ii)

Cycloolefin copolymer resin film (trade name: Zeonor Film (registered trademark) ZF-16, manufactured by Zeon Corporation) with a thickness of 100 μm was adopted as base.

Then, the same procedure as in Example B10 was carried out to produce a laminate sheet (sheet (ii)) that contained a substrate layer with a thickness of 1 μm formed on a base, in which crosslinked components were included and in which a phase-separated structure had been formed by irradiating the components with ultraviolet ray, i.e. a kind of electromagnetic wave, while they were in a mutually dissolved state, and it was found to contain a co-continuous type phase-separated structure with a structural period of 0.051 μm.

(Formation of Inorganic Substance Layer)

The same procedure as in Example B6 was carried out to produce an inorganic substance layer, specifically an [inorganic A] layer, with a layer thickness of 150 nm on the substrate layer of sheet (ii).

(Inorganic Substance-Laminated Sheet)

A substrate layer and an inorganic substance layer were formed on a base as described above to produce an inorganic substance-laminated sheet. The inorganic substance-laminated sheet of this example, unlike Example B10, was composed of a base formed of cycloolefin resin film on which a substrate layer and an inorganic substance layer had been formed by the same procedure as in Example B10. High gas barrier properties were also achieved in spite of the use of a different base.

Comparative Example B1

Formation of Substrate Layer of Sheet

Polyethylene terephthalate film (trade name: Lumirror (registered trademark) U48, manufactured by Toray Industries, Inc.) with a thickness of 50 μm was used as base.

Subsequently, pentaerythritol tetraacrylate alone was adopted as component for substrate layer formation and 2-methyl 1-[4-(methylthio)phenyl]-2-morpholinopropane-1-one (IRGACURE 907, manufactured by BASF) and 2-benzyl-2-dimethylamino-1-(4-morpholinophenyl) butanone-1 (IRGACURE 369 manufactured by BASF) were added as photopolymerization initiators each in an amount of 2.5 mass % (a total of 5 mass %) relative to pentaerythritol tetraacrylate. Then, a solvent of ethyl acetate and cyclohexanone mixed at a ratio of 70/30 [mass ratio] was added to dilute the mixture to a solid content of 10 mass %, thereby preparing a coating liquid for substrate layer formation.

Following this, the coating liquid for substrate layer formation was applied to a base with a Micro Gravure. Coater (gravure line number 80R, gravure rotation ratio 100%), dried by heating at 80° C. for 30 seconds, and polymerized by application of ultraviolet ray at 0.8 J/cm2 to form a substrate layer with a thickness of 1 μm. This substrate layer contained no phase-separated structure.

(Formation of Inorganic Substance Layer)

The same procedure as in Example B1 was carried out to produce an inorganic substance layer of a silicon compound with a layer thickness of 100 nm on the substrate layer.

(Inorganic Substance-Laminated Sheet)

A substrate layer and an inorganic substance layer were formed on a base as described above to produce an inorganic substance-laminated sheet. The inorganic substance-laminated sheet of this comparative example was composed of a substrate layer free of phase-separated structures and an inorganic substance layer of a silicon compound laminated thereon and had poorer gas barrier properties as compared with Examples B1 to B5 where an inorganic substance layer was formed in a similar way on a substrate layer having a phase-separated structure.

Comparative Example B2

Formation of Substrate Layer of Sheet

The same procedure as in Comparative example B1 was carried out to produce a substrate layer free of phase-separated structures with a thickness of 1 μm on a base.

(Formation of Inorganic Substance Layer)

The same procedure as in Example B6 was carried out to produce an inorganic substance layer, specifically an [inorganic A] layer, with a layer thickness of 150 nm on the aforementioned substrate layer.

(Inorganic Substance-Laminated Sheet)

A substrate layer and an inorganic substance layer were formed on a base as described above to produce an inorganic substance-laminated sheet. The inorganic substance-laminated sheet of this comparative example was composed of a substrate layer free of phase-separated structures and an inorganic substance layer, specifically an [inorganic A] layer, laminated thereon and had poorer gas barrier properties as compared with Examples B6 to B17, B21, B22, and B23 where an inorganic substance layer was formed in a similar way on a substrate layer having a phase-separated structure.

Comparative Example B3

Formation of Substrate Layer of Sheet

The same procedure as in Comparative example B1 was carried out to produce a substrate layer free of phase-separated structures with a thickness of 1 μm on a base.

(Formation of Inorganic Substance Layer)

The same procedure as in Example B19 was carried out to produce an inorganic substance layer, specifically an [inorganic B] layer, with a layer thickness of 150 nm on the aforementioned substrate layer.

(Inorganic Substance-Laminated Sheet)

A substrate layer and an inorganic substance layer were formed on a base as described above to produce an inorganic substance-laminated sheet. The inorganic substance-laminated sheet of this comparative example was composed of a substrate layer free of phase-separated structures and an inorganic substance layer, specifically an [inorganic B] layer, laminated thereon and had poorer gas barrier properties as compared with Example B19 where an inorganic substance layer was formed in a similar way on a substrate layer having a phase-separated structure.

Comparative Example B4

Formation of Substrate Layer of Sheet

The same procedure as in Comparative example B1 was carried out to produce a substrate layer free of phase-separated structures with a thickness of 1 μm on a base.
(Formation of Inorganic Substance Layer)
The same procedure as in Example B20 was carried out to produce an inorganic substance layer containing an aluminum compound with a layer thickness of 20 nm on the substrate layer.
(Inorganic Substance-Laminated Sheet)
A substrate layer and an inorganic substance layer were formed on a base as described above to produce an inorganic substance-laminated sheet. The inorganic substance-laminated sheet of this comparative example was composed of a substrate layer free of phase-separated structures and an inorganic substance layer of an aluminum compound laminated thereon and had poorer gas barrier properties as compared with Example B20 where an inorganic substance layer was formed in a similar way on a substrate layer having a phase-separated structure.

Comparative Example B5

Formation of Substrate Layer of Sheet

Polyethylene terephthalate film (trade name: Lumirror (registered trademark) U48, manufactured by Toray Industries, Inc.) with a thickness of 50 μm was used as base.
Then, methyl methacrylate and polystyrene adopted as components for substrate layer formation were mixed at a ratio of 50/50 [mass ratio] and azobisisobutyronitrile was added as thermal polymerization initiator in an amount of 0.5 mass % relative to methyl methacrylate. Furthermore, a mixed solvent of toluene and acetone mixed at 50/50 [mass ratio] was added for dilution to a solid content of 10 mass %, thereby preparing a coating liquid for substrate layer formation.

Following this, the coating liquid for substrate layer formation was applied to a base with a Micro Gravure Coater (gravure line number 80R, gravure rotation ratio 100%), and heated at 80° C. for 60 minutes to perform polymerization to form a substrate layer with a thickness of 1 μm. This substrate layer was one free of crosslinked components and produced from components in a non-mutually dissolved state and it had a sea-island type phase-separated structure with a structural period of 104 μm. This structural period was more than 100 μm when measured by method A.
(Formation of Inorganic Substance Layer)
The same procedure as in Example B6 was carried out to produce an inorganic substance layer, specifically an [inorganic A] layer, with a layer thickness of 150 nm on the aforementioned substrate layer.
(Inorganic Substance-Laminated Sheet)
A substrate layer and an inorganic substance layer were formed on a base as described above to produce an inorganic substance-laminated sheet. Though the substrate layer had a sea-island type phase-separated structure, the inorganic substance-laminated sheet of this comparative example had a structural period of 104 μm, which was larger than the intended range, and accordingly had poorer gas barrier properties as compared with Example B6 where an inorganic substance layer was formed in a similar way.

TABLE 2

| | sheet | | | | | | | inorganic substance | | |
|---|---|---|---|---|---|---|---|---|---|---|
| | | | substrate layer | | | | | layer | | water vapor |
| | sheet consti-tution | base (*1) | dispersed structure | structural period [μm] | cross-linked component | production process | | type (*3) | thick-ness [nm] | permeability [g/(m² · 24 h · atm)] |
| | | | | | | pro-cess (*2) | conditions | | | |
| Example B1 | lami-nate | PET | sea-island structure (phase-separated structure) | 96 | absent | B | heat | silicon compound based layer | 100 | $8.7 \times 10^{-2}$ |
| Example B2 | lami-nate | PET | sea-island structure (phase-separated structure) | 54 | absent | B | heat | silicon compound based layer | 100 | $7.1 \times 10^{-2}$ |
| Example B3 | lami-nate | PET | sea-island structure (phase-separated structure) | 45 | absent | B | heat | silicon compound based layer | 100 | $3.9 \times 10^{-2}$ |
| Example B4 | lami-nate | PET | sea-island structure (phase-separated structure) | 1.3 | absent | B | heat | silicon compound based layer | 100 | $2.2 \times 10^{-2}$ |
| Example B5 | lami-nate | PET | sea-island structure (phase-separated structure) | 0.7 | absent | A | ultra-violet ray | silicon compound based layer | 100 | $8.8 \times 10^{-3}$ |
| Example B6 | lami-nate | PET | sea-island structure (phase-separated structure) | 0.7 | absent | A | ultra-violet ray | inorganic A-layer | 150 | $2.1 \times 10^{-3}$ |
| Example B7 | lami-nate | PET | co-continuous structure (phase-separated structure) | 0.15 | absent | A | ultra-violet ray | inorganic A-layer | 150 | $1.0 \times 10^{-3}$ |
| Example B8 | lami-nate | PET | co-continuous structure (phase-separated structure) | 0.093 | present | A | ultra-violet ray | inorganic A-layer | 150 | $7.3 \times 10^{-4}$ |
| Example B9 | lami-nate | PET | co-continuous structure (phase-separated structure) | 0.082 | present | A | ultra-violet ray | inorganic A-layer | 150 | $6.8 \times 10^{-4}$ |
| Example B10 | lami-nate | PET | co-continuous structure (phase-separated structure) | 0.051 | present | A | ultra-violet ray | inorganic A-layer | 150 | $6.4 \times 10^{-4}$ |
| Example B11 | lami-nate | PET | co-continuous structure (phase-separated structure) | 0.024 | present | A | ultra-violet ray | inorganic A-layer | 150 | $2.5 \times 10^{-4}$ |
| Example B12 | lami-nate | PET | co-continuous structure (phase-separated structure) | 0.012 | present | A | ultra-violet ray | inorganic A-layer | 150 | $1.5 \times 10^{-4}$ |

TABLE 2-continued

| | sheet consti-tution | base (*1) | dispersed structure | structural period [μm] | cross-linked component | production process pro-cess (*2) | production process conditions | type (*3) | thick-ness [nm] | water vapor permeability [g/(m² · 24 h · atm)] |
|---|---|---|---|---|---|---|---|---|---|---|
| Example B13 | laminate | PET | co-continuous structure (phase-separated structure) | 0.006 | present | A | ultra-violet ray | inorganic A-layer | 150 | $7.6 \times 10^{-4}$ |
| Example B14 | laminate | PET | co-continuous structure (phase-separated structure) | 0.003 | present | A | ultra-violet ray | inorganic A-layer | 150 | $2.7 \times 10^{-3}$ |
| Example B15 | laminate | PET | co-continuous structure (phase-separated structure) | 0.051 | present | A | ultra-violet ray | inorganic A-layer | 120 | $8.6 \times 10^{-4}$ |
| Example B16 | laminate | PET | co-continuous structure (phase-separated structure) | 0.051 | present | A | ultra-violet ray | inorganic A-layer | 100 | $4.0 \times 10^{-3}$ |
| Example B17 | laminate | PET | co-continuous structure (phase-separated structure) | 0.051 | present | A | ultra-violet ray | inorganic A-layer | 50 | $1.1 \times 10^{-2}$ |
| Example B18 | laminate | PET | co-continuous structure (phase-separated structure) | 0.051 | present | A | ultra-violet ray | inorganic A-layer | 15 | $1.8 \times 10^{-1}$ |
| Example B19 | laminate | PET | co-continuous structure (phase-separated structure) | 0.051 | present | A | ultra-violet ray | inorganic B-layer | 150 | $8.2 \times 10^{-4}$ |
| Example B20 | laminate | PET | co-continuous structure (phase-separated structure) | 0.051 | present | A | ultra-violet ray | aluminum compound based layer | 20 | $3.6 \times 10^{-1}$ |
| Example B21 | laminate | PEN | co-continuous structure (phase-separated structure) | 0.051 | present | A | ultra-violet ray | inorganic A-layer | 150 | $5.6 \times 10^{-4}$ |
| Example B22 | laminate | COC | co-continuous structure (phase-separated structure) | 0.051 | present | A | ultra-violet ray | inorganic A-layer | 150 | $4.6 \times 10^{-4}$ |
| Example B23 | laminate | COP | co-continuous structure (phase-separated structure) | 0.051 | present | A | ultra-violet ray | inorganic A-layer | 150 | $4.7 \times 10^{-4}$ |
| Comparative example B1 | laminate | PET | absent (mutually dissolved state) | — | present | A | ultra-violet ray | silicon compound based layer | 100 | $3.8 \times 10^{-1}$ |
| Comparative example B2 | laminate | PET | absent (mutually dissolved state) | — | present | A | ultra-violet ray | inorganic A-layer | 150 | $7.2 \times 10^{-2}$ |
| Comparative example B3 | laminate | PET | absent (mutually dissolved state) | — | present | A | ultra-violet ray | inorganic B-layer | 150 | $5.5 \times 10^{-2}$ |
| Comparative example B4 | laminate | PET | absent (mutually dissolved state) | — | present | A | ultra-violet ray | aluminum compound based layer | 20 | 2.3 |
| Comparative example B5 | laminate | PET | sea-island structure (phase-separated structure) | 104 | absent | B | heat | inorganic A-layer | 150 | $6.4 \times 10^{-2}$ |

(*1) Details are as follows:
PET: polyethylene terephthalate
PEN: polyethylene naphthalate
COC: cycloolefin copolymer resin
COP: cycloolefin resin
(*2) Details are as follows:
A: Including a step for forming a phase-separated structure via a mutually dissolved state of components for sheet formation
B: Not including a step for forming a phase-separated structure via a mutually dissolved state of components for sheet formation
(*3) Details are as follows:
Inorganic A-layer: A layer of a phase in which zinc oxide, silicon dioxide, and aluminum oxide coexist.
Inorganic B-layer: A layer of a phase in which zinc sulfide and silicon dioxide coexist.

When applied to the production of an inorganic compound layer, the sheet according to the present invention serves to control the structure of the inorganic compound layer and thereby improve its gas barrier properties and accordingly, it can be used suitably in various articles including, but not limited to, packaging materials for foodstuffs and pharmaceuticals as well as solar batteries and display devices such as touch panels, electronic paper, liquid crystal displays, organic EL displays, and organic EL lighting.

EXPLANATION OF NUMERALS

1: surface having a dispersed structure
2: inorganic substance layer
3a: substrate layer having a dispersed structure
3b: base
4: monolayer sheet having a dispersed structure (sheet (i))
5: laminate sheet having a dispersed structure (sheet (ii))
6: continuous phase A in co-continuous type phase-separated structure
7: continuous phase B in co-continuous type phase-separated structure
8: sea phase A in sea-island type phase-separated structure
9: island phase B in sea-island type phase-separated structure
10: phase A in cylinder type phase-separated structure
11: phase B in cylinder type phase-separated structure
12: phase A in gyroid type phase-separated structure
13: phase B in gyroid type phase-separated structure
14: phase A in lamella type phase-separated structure
15: phase B in lamella type phase-separated structure

The invention claimed is:
1. An inorganic substance-laminated sheet comprising a sheet having a dispersed structure with a structural period of 0.01 μm to 1 μm on at least one surface and an inorganic substance layer covering the surface having the dispersed structure, wherein the inorganic substance layer contains a zinc compound and a silicon compound.

2. An inorganic substance-laminated sheet as described in claim 1, wherein the sheet comprises a base and a substrate layer having a dispersed structure with a structural period of 0.01 µm to 1 µm, the substrate layer covering at least one surface of the base.

3. An inorganic substance-laminated sheet as described in claim 1, wherein the dispersed structure is a phase-separated structure.

4. An inorganic substance-laminated sheet as described in claim 3, wherein the phase-separated structure is either a co-continuous one or a sea-island one.

5. An inorganic substance-laminated sheet as described in claim 3, wherein the phase-separated structure is either a co-continuous structure or a sea-island structure, and wherein the sheet contains a polymer alloy including at least two resin components.

6. An inorganic substance-laminated sheet as described in claim 5, wherein the co-continuous structure or the sea-island structure in the inorganic substance-laminated sheet is one formed by subjecting at least two resin components to phase separation through spinodal decomposition.

7. An inorganic substance-laminated sheet as described in claim 5, wherein the polymer alloy contains a bi- or polyfunctional crosslinked component.

8. An inorganic substance-laminated sheet as described in claim 1, wherein the inorganic substance layer contains at least one element that belongs to any of the 1st to 17th groups in the 2nd to 6th rows of the periodic table.

9. An inorganic substance-laminated sheet comprising a sheet having a dispersed structure with a structural period of 0.01 µm to 1 µm on at least one surface and an inorganic substance layer covering the surface having the dispersed structure, wherein the inorganic substance layer is either an inorganic A-layer or an inorganic B-layer as specified below:

inorganic A-layer: a layer of a phase in which zinc oxide, silicon dioxide, and aluminum oxide coexist, and inorganic B-layer: a layer of a phase in which zinc sulfide and silicon dioxide coexist.

10. An electronic device comprising an inorganic substance-laminated sheet as described in claim 1.

11. An electronic device comprising an inorganic substance-laminated sheet comprising a sheet having a dispersed structure with a structural period of 0.01 µm to 1 µm on at least one surface and an inorganic substance layer covering the surface having the dispersed structure, wherein the inorganic substance layer contains a zinc compound and a silicon compound.

* * * * *